(12) United States Patent
Komatsu et al.

(10) Patent No.: US 11,876,507 B2
(45) Date of Patent: *Jan. 16, 2024

(54) ACOUSTIC WAVE RESONATOR WITH INTERDIGITAL TRANSDUCER ELECTRODE APERTURE FOR FILTER STEEPNESS

(71) Applicant: Skyworks Solutions, Inc., Irvine, CA (US)

(72) Inventors: Tomoya Komatsu, Irvine, CA (US); Yiliu Wang, Irvine, CA (US); Akira Ochiai, Suita (JP); Joshua James Caron, Madison, NC (US)

(73) Assignee: Skyworks Solutions, Inc., Irvine, CA (US)

( * ) Notice: Subject to any disclaimer, the term of this patent is extended or adjusted under 35 U.S.C. 154(b) by 371 days.

This patent is subject to a terminal disclaimer.

(21) Appl. No.: 17/124,862

(22) Filed: Dec. 17, 2020

(65) Prior Publication Data

US 2021/0105004 A1      Apr. 8, 2021

Related U.S. Application Data

(63) Continuation of application No. 16/900,175, filed on Jun. 12, 2020, now Pat. No. 11,451,212.

(Continued)

(51) Int. Cl.
*H03H 9/64* (2006.01)
*H03H 9/25* (2006.01)
(Continued)

(52) U.S. Cl.
CPC ...... *H03H 9/6483* (2013.01); *H03H 9/02834* (2013.01); *H03H 9/25* (2013.01); *H03H 9/6406* (2013.01); *H03H 9/725* (2013.01)

(58) Field of Classification Search
CPC .... H03H 9/6483; H03H 9/02834; H03H 9/25; H03H 9/6406; H03H 9/725
See application file for complete search history.

(56) References Cited

U.S. PATENT DOCUMENTS 6,707,352 B2    3/2004  Kawaguchi
7,576,471 B1    8/2009  Solal
(Continued)

FOREIGN PATENT DOCUMENTS

| JP | 2013138333 | | 7/2013 |
|----|------------|-|--------|
| JP | 2014160888 | | 9/2014 |
| JP | 2014160888 | A * | 9/2014 |

OTHER PUBLICATIONS

M. Solal et al., "A method to reduce losses in buried electrodes RF SAW resonators," IEEE Ultrasonics Symposium 2011, pp. 324-332.

(Continued)

*Primary Examiner* — Samuel S Outten
(74) *Attorney, Agent, or Firm* — Knobbe, Martens, Olson & Bear, LLP

(57) ABSTRACT

Aspects of this disclosure relate to an acoustic wave filter with an acoustic wave resonator arranged to concentrate a transverse spurious mode at a frequency. Such an acoustic wave resonator can have a narrow aperture to concentrate the transverse spurious mode. The transverse spurious mode can increase steepness of a skirt of the acoustic wave filter. Related methods, acoustic wave devices, multiplexers, radio frequency front ends, radio frequency modules, and wireless communication devices are disclosed.

20 Claims, 13 Drawing Sheets

Related U.S. Application Data

(60) Provisional application No. 62/863,688, filed on Jun. 19, 2019, provisional application No. 62/863,733, filed on Jun. 19, 2019.

(51) Int. Cl.
*H03H 9/72* (2006.01)
*H03H 9/02* (2006.01)

(56) References Cited

U.S. PATENT DOCUMENTS

| | | | |
|---|---|---|---|
| 9,035,725 | B2 | 5/2015 | Komatsu et al. |
| 9,748,924 | B2 | 8/2017 | Komatsu et al. |
| 11,451,212 | B2 | 9/2022 | Komatsu et al. |
| 2017/0093372 | A1* | 3/2017 | Yokoyama ........... H03H 9/6423 |
| 2019/0115947 | A1* | 4/2019 | Nosaka .................... H04B 1/50 |
| 2019/0356297 | A1* | 11/2019 | Komiyama .......... B23K 26/359 |
| 2020/0212876 | A1 | 7/2020 | Goto et al. |
| 2020/0403601 | A1 | 12/2020 | Komatsu et al. |

OTHER PUBLICATIONS

T. Bauer, et al., "A Bright Outlook for Acoustic Filtering," IEEE Microwave Magazine, published Jul. 10, 2015.

\* cited by examiner

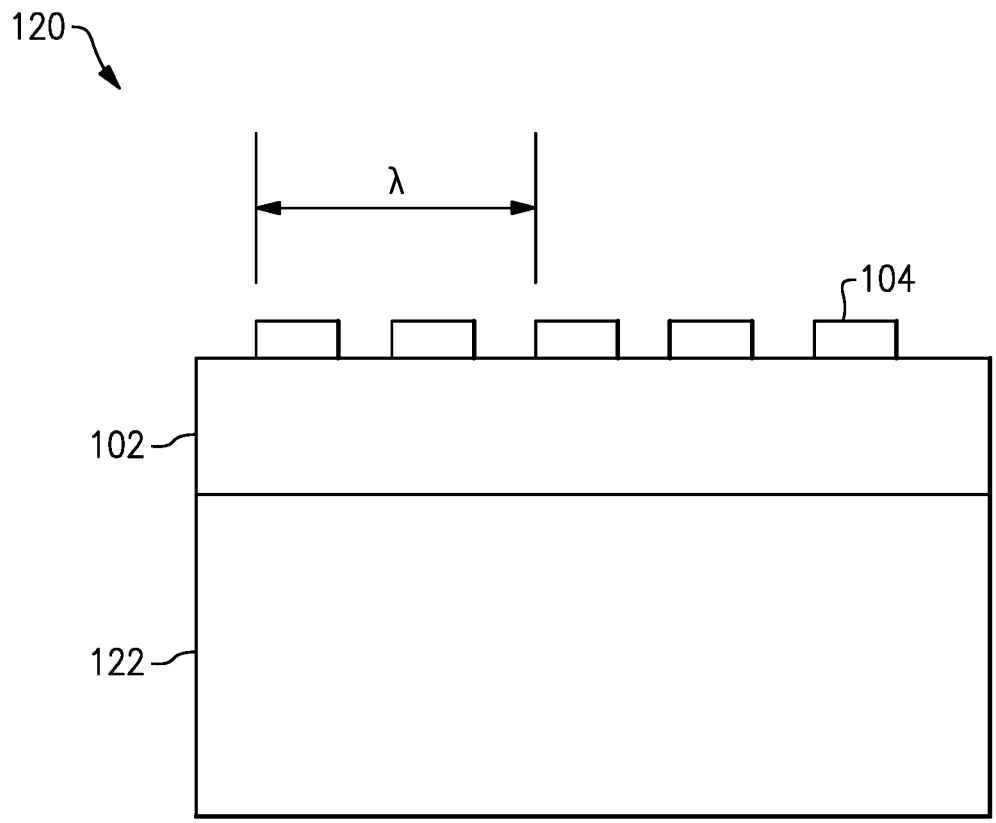
FIG.12
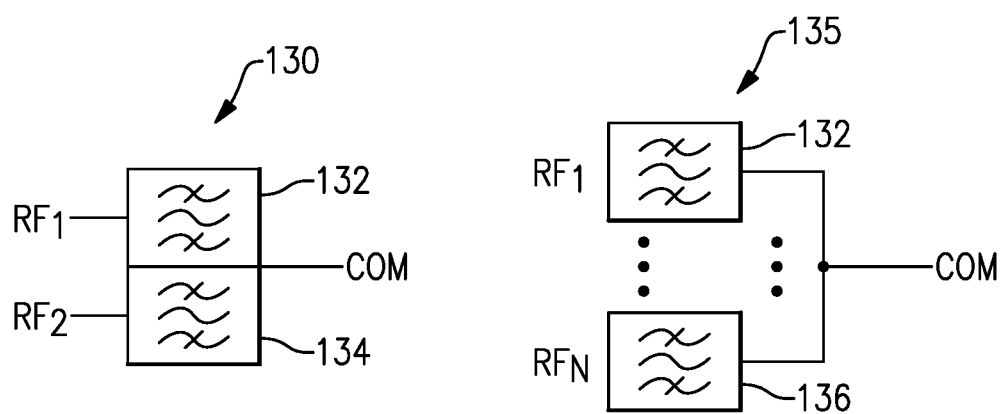
FIG.13A
FIG.13B

ACOUSTIC WAVE RESONATOR WITH INTERDIGITAL TRANSDUCER ELECTRODE APERTURE FOR FILTER STEEPNESS

CROSS-REFERENCE TO RELATED APPLICATION

Any and all applications for which a foreign or domestic priority claim is identified in the Application Data Sheet, or any correction thereto, are hereby incorporated by reference under 37 CFR 1.57.

BACKGROUND

Technical Field

Embodiments of this disclosure relate to acoustic wave devices and/or acoustic wave filters.

Description of Related Technology

An acoustic wave filter can include a plurality of resonators arranged to filter a radio frequency signal. Example acoustic wave filters include surface acoustic wave (SAW) filters and bulk acoustic wave (BAW) filters. A surface acoustic wave resonator can include an interdigital transductor electrode on a piezoelectric substrate. The surface acoustic wave resonator can generate a surface acoustic wave on a surface of the piezoelectric layer on which the interdigital transductor electrode is disposed.

Acoustic wave filters can be implemented in radio frequency electronic systems. For instance, filters in a radio frequency front end of a mobile phone can include acoustic wave filters. An acoustic wave filter can be a band pass filter. A plurality of acoustic wave filters can be arranged as a multiplexer. For example, two acoustic wave filters can be arranged as a duplexer.

An acoustic wave filter with a relatively steep edge of a pass band can be desirable. Designing such an acoustic wave filter can be challenging.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is an acoustic wave filter with a transverse spurious mode for increasing filter skirt steepness. The acoustic wave filter includes a plurality of series acoustic wave resonators and a plurality of shunt acoustic wave resonators. The plurality of series acoustic wave resonators includes a first series acoustic wave resonator. The first series acoustic wave resonator is configured to concentrate a transverse spurious mode at a frequency. The plurality of series acoustic wave resonators and the plurality of shunt acoustic wave resonators are together arranged to filter a radio frequency signal. The transverse spurious mode of the first series acoustic wave resonator is configured to increase steepness of a skirt of the acoustic wave filter.

The first series acoustic wave resonator can include an interdigital transducer electrode and be configured to generate an acoustic wave having a wavelength of $\lambda$, in which the interdigital transducer electrode having an aperture of less than $10\lambda$. The aperture can be less than $7\lambda$. The aperture can be at least $3\lambda$. The aperture can be at least $1\lambda$. The plurality of series acoustic wave resonators can include additional series acoustic wave resonators having respective interdigital transducer electrodes having apertures of less than $10\lambda$. The shunt acoustic wave resonators can each include an interdigital transducer electrode having an aperture of at least $15\lambda$. The apertures of the respective shunt interdigital transducer electrodes can be no greater than $30\lambda$.

The first series acoustic wave resonator may not include a piston mode structure.

The plurality of shunt acoustic wave resonators can each include an interdigital transducer electrode having an aperture that is greater than an aperture of an interdigital transducer electrode of the first series acoustic wave resonator.

The frequency can be above a resonant frequency of the first series acoustic wave resonator, and the skirt of the acoustic wave filter can be above a pass band of the acoustic wave filter.

The first series acoustic wave resonator can be a surface acoustic wave resonator. The first series acoustic wave resonator can be a temperature compensated surface acoustic wave resonator. The plurality of shunt acoustic wave resonators and the plurality of series acoustic wave resonators can be temperature compensated surface acoustic wave resonators.

The acoustic wave filter can be a transmit filter.

Another aspect of this disclosure is an acoustic wave filter with a transverse spurious mode for increasing skirt steepness. The acoustic wave filter includes a plurality of shunt acoustic wave resonators including a first shunt acoustic wave resonator. The first shunt acoustic wave resonator is configured to concentrate a transverse spurious mode at a frequency. The acoustic wave filter also includes a plurality of series acoustic wave resonators. The plurality of shunt acoustic wave resonators and the plurality of series acoustic wave resonators are together arranged to filter a radio frequency signal. The transverse spurious mode of the first shunt acoustic wave resonator configured to increase skirt steepness of the acoustic wave filter.

The first shunt acoustic wave resonator can include an interdigital transducer electrode and be configured to generate an acoustic wave having a wavelength of $\lambda$, in which the interdigital transducer electrode has an aperture of less than $10\lambda$. The aperture can be at least $1\lambda$. The aperture can be at least $3\lambda$. The aperture can be less than $7\lambda$.

The first shunt acoustic wave resonator can be a temperature compensated surface acoustic wave resonator without a piston mode structure.

Another aspect of this disclosure is an acoustic wave filter with a transverse spurious mode for increasing skirt steepness. The acoustic wave filter includes a plurality of acoustic wave resonators configured to filter a radio frequency signal. The plurality of acoustic wave resonators includes a first acoustic wave resonator that includes an interdigital transducer electrode and is configured to generate an acoustic wave having a wavelength of $\lambda$. The interdigital transducer electrode has an aperture of less than $10\lambda$ to concentrate a transverse spurious mode at a frequency. The transverse spurious mode of the first acoustic wave resonator is configured to increase steepness of a skirt of the acoustic wave filter.

The plurality of acoustic wave resonators can include a plurality of series acoustic wave resonators and a plurality of shunt acoustic wave resonators, in which the plurality of series acoustic wave resonators includes the first acoustic wave resonator. The plurality of series acoustic wave resonators can include additional series acoustic wave resonators having respective interdigital transducer electrodes having apertures of less than 10λ. The plurality of shunt acoustic wave resonators can each include an interdigital transducer electrode having an aperture that is greater than the aperture of the interdigital transducer electrode of the first series acoustic wave resonator. The plurality of shunt acoustic wave resonators can each include a shunt interdigital transducer electrode having an aperture of at least 15λ.

The plurality of acoustic wave resonators can include a plurality of series acoustic wave resonators and a plurality of shunt acoustic wave resonators, in which the plurality of shunt acoustic wave resonators includes the first acoustic wave resonator.

The aperture can be less than 7λ. The aperture can be at least 3λ. The aperture can be at least 1λ.

The first acoustic wave resonator may not include a piston mode structure.

The frequency can be above a resonant frequency of the first acoustic wave resonator, and the skirt of the acoustic wave filter can be above the cutoff frequency of an upper edge of a passband of the acoustic wave filter.

The acoustic wave filter can be a transmit filter.

The first acoustic wave resonator can be a surface acoustic wave resonator. The first acoustic wave resonator can be a temperature compensated surface acoustic wave resonator. The plurality of acoustic wave resonators can be temperature compensated surface acoustic wave resonators.

Another aspect of this disclosure is a surface acoustic wave resonator that includes a piezoelectric layer and an interdigital transducer electrode on the piezoelectric layer. The surface acoustic wave resonator is configured to generate a surface acoustic wave having a wavelength of λ. The interdigital transducer electrode has an aperture of less than 10λ to concentrate a transverse spurious mode at a frequency.

The aperture can be less than 7λ. The aperture can be at least 3λ. The aperture can be at least 1λ.

The surface acoustic wave resonator can be a temperature compensated surface acoustic wave resonator without a piston mode structure.

A multiplexer can include an acoustic wave filter with any suitable combination of features disclosed in the preceding paragraphs coupled to a common node and a second acoustic wave filter coupled to the common node.

A packaged radio frequency module can include an acoustic wave filter with any suitable combination of features disclosed in the preceding paragraphs, a radio frequency amplifier, and a radio frequency switch coupled between the acoustic wave filter and the radio frequency switch. The acoustic wave filter, the radio frequency amplifier, and the radio frequency switch are enclosed within a common package.

A radio frequency front end can include an acoustic wave filter with any suitable combination of features disclosed in the preceding paragraphs and a radio frequency amplifier coupled to the acoustic wave filter.

A wireless communication device can include an acoustic wave filter with any suitable combination of features disclosed in the preceding paragraphs and an antenna operatively coupled to the acoustic wave filter.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

FIG. 12 is a diagram of a cross section of a multilayer piezoelectric substrate SAW resonator according to an embodiment.

FIG. 13A is a schematic diagram of a duplexer that includes an acoustic wave filter according to an embodiment.

FIG. 13B is a schematic diagram of a multiplexer that includes an acoustic wave filter according to an embodiment.

DETAILED DESCRIPTION OF CERTAIN EMBODIMENTS

Figure 1:
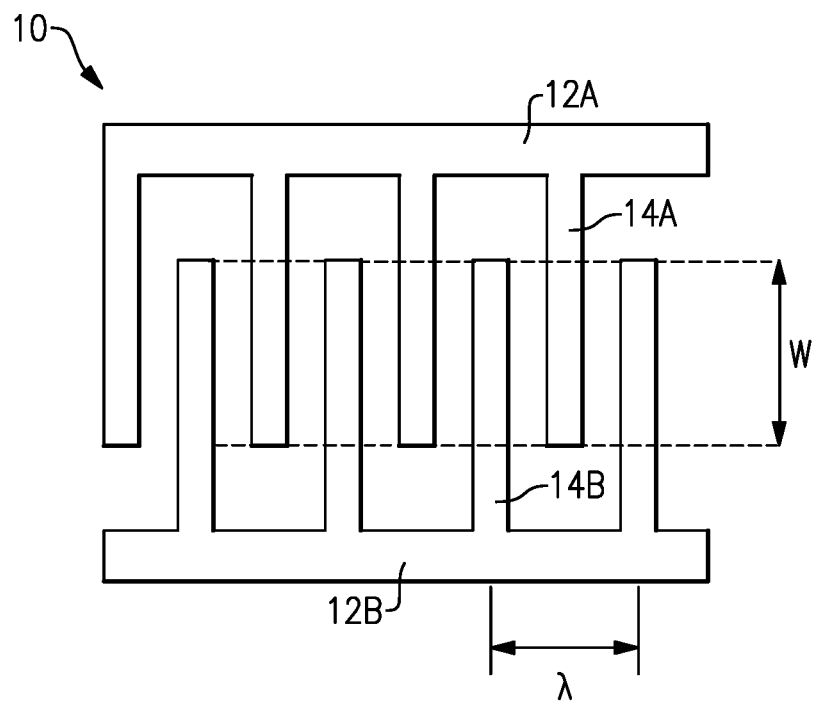
FIG. 1 is a diagram of an interdigital transducer (IDT) electrode of an acoustic wave resonator.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

For a surface acoustic wave (SAW) device with relatively high confinement of SAW energy, there can be the multiple resonances in a transverse direction. The transverse direction can be an interdigital transducer (IDT) electrode aperture direction. Resonances in the transverse direction can cause problems in filter performance. A wider aperture can cause more transverse modes with smaller magnitude. A narrower aperture can cause fewer transverse modes with greater magnitude.

Piston-mode technology can suppress transverse modes and create a main mode with a relatively high quality factor (Q). However, with piston mode structures, it can be difficult to create a sufficiently steep skirt in a filter response near the passband of the filter to meet certain specifications.

The skirt of a filter response can be a range of frequencies in which the filter transitions between a passband and a stopband. The skirt of the filter response can be defined as the region between the cutoff frequency of the passband and the corner frequency of the stopband. In a band pass filter, a steep filter skirt can contribute to achieving a relatively low insertion loss in a passband. A steep filter skirt can enable high rejection of frequencies close to the passband. High rejection of frequencies close to the passband and low insertion loss are both generally desirable in wireless communications systems. BAW filters have traditionally achieved steeper filter skirts than SAW filters at relatively high frequencies. Accordingly, SAW filters can have more significant technical challenges meeting filter skirt steepness specifications than BAW filters.

An additional attenuation pole can be created by including additional circuit components with an acoustic wave filter. The additional circuit components can improve steepness of the filter response near the passband. However, the additional circuit components consume area.

Aspects of this disclosure relate to using one or more acoustic wave resonators to increase steepness of a filter response near the passband. Accordingly, increased skirt steepness can be achieved without additional circuit components that are external to the acoustic wave filter. Surface acoustic wave resonators disclosed herein can include an aperture that is sufficiently narrow to concentrate a transverse mode at a frequency. In certain such surface acoustic wave resonators, a piston mode structure to suppress transverse modes is not implemented. The concentrated transverse mode of the surface acoustic wave resonator can increase steepness of the filter skirt. In certain embodiments, an acoustic wave filter includes series surface acoustic wave resonators that each include a relatively narrow aperture to concentrate a transverse mode at a frequency and shunt acoustic wave resonators with wider apertures.

Advantages of a narrow IDT electrode aperture can include, with same capacitance (active area), less Ohmic loss and improved quality factor (Q) at series resonance (fs). From a layout standpoint, a narrower IDT aperture can reduce die size.

FIG. 1 is a diagram of an interdigital transducer (IDT) electrode 10 of an acoustic wave resonator. The IDT electrode 10 is shown in plan view. The IDT electrode 10 can be included in a SAW resonator in certain embodiments. As illustrated, the IDT electrode 10 includes a first bus bar 12A, a second bus bar 12B, first IDT fingers 14A extending from the first bus bar 12A, and second IDT fingers 14B extending from the second bus bar 12B. The IDT fingers 14A have a pitch of λ. A SAW resonator that includes the IDT electrode 10 is configured to generate a surface acoustic wave having a wavelength of λ. The IDT electrode 10 can be positioned between two acoustic reflectors (not illustrated). The IDT electrode 10 is positioned on a piezoelectric layer. The IDT electrode 10 has an aperture of W. The aperture is in the region in which both the first IDT fingers 14A and the second IDT fingers 14B are present between the first bus bar 12A and the second bus bar 12B, as shown in FIG. 1.

Figure 2:
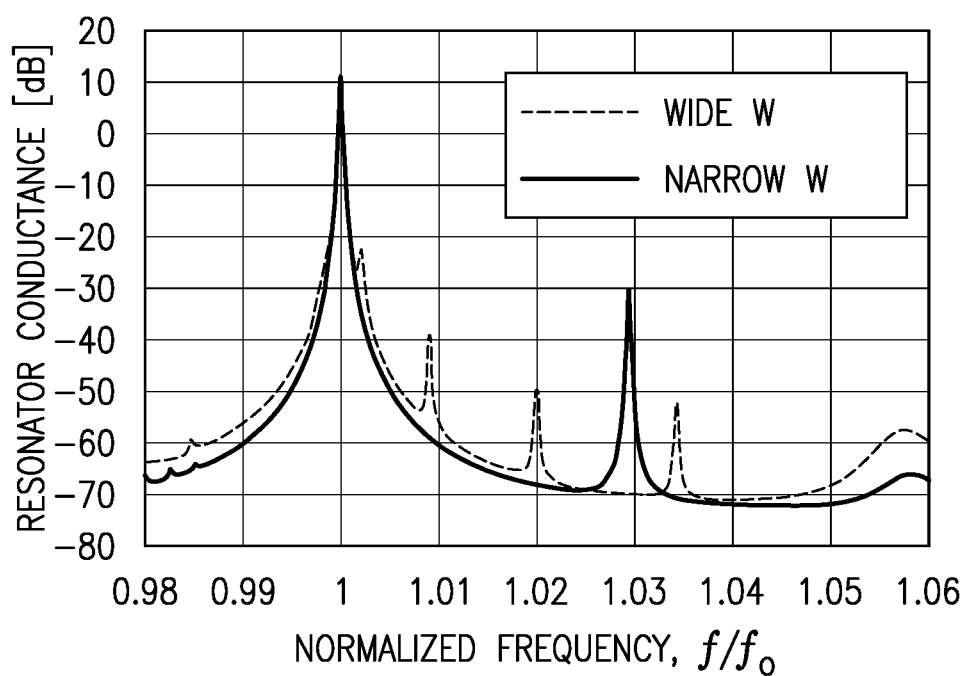
FIG. 2 is a graph of resonator conductance for a surface acoustic wave (SAW) resonators with different apertures for an IDT electrode of FIG. 1.

IDT aperture W can impact transverse spurious modes. FIG. 2 is a graph of resonator conductance for a SAW resonator with different apertures for the IDT electrode 10 of FIG. 1. Changes in resonators performance were simulated for different apertures W of the IDT electrode 10. FIG. 2 indicates that a wider aperture W can cause more transverse spurious modes than a narrower aperture W. FIG. 2 also indicates that transverse spurious modes of the IDT electrode with wider aperture W have a smaller magnitude than the transverse spurious mode of the IDT electrode with the narrow aperture W. With an infinitely wide aperture W, there can theoretically be no transverse spurious mode.

Figure 3:
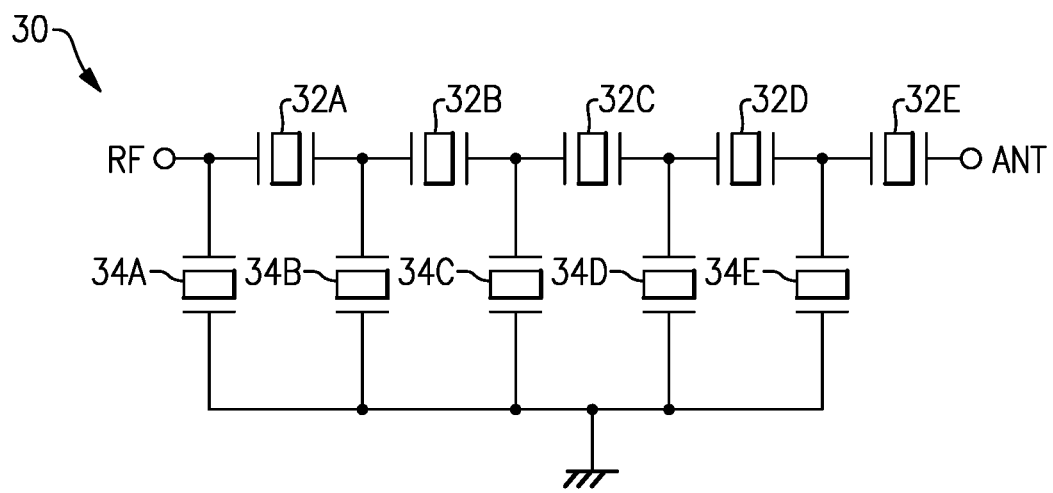
FIG. 3 is a schematic diagram of a ladder filter.

FIG. 3 is a schematic diagram of a ladder filter 30. The ladder filter 30 is an example topology of a filter formed from acoustic wave resonators. The ladder filter 30 can be a band pass filter. In a band pass filter with a ladder filter topology, the shunt resonators can have lower resonant frequencies than the series resonators. The ladder filter 30 can be arranged to filter a radio frequency (RF) signal.

As illustrated, the ladder filter 30 includes series acoustic wave resonators 32A, 32B, 32C, 32D, and 32E and shunt acoustic wave resonators 34A, 34B, 34C, 34D, and 34E. The acoustic wave resonators of the ladder filter 30 are coupled between an RF port RF and an antenna port ANT. The acoustic wave resonators of the ladder filter 30 can include any suitable series acoustic wave resonators and/or shunt acoustic wave resonators. The RF port can be a transmit port for a transmit filter or a receive port for a receive filter. Each stage of the ladder filter 30 includes a series acoustic wave resonator and a shunt acoustic wave resonator. For example, a stage of the ladder filter 30 includes the shunt acoustic wave resonator 34A and the series acoustic wave resonator 32A.

Figure 4:
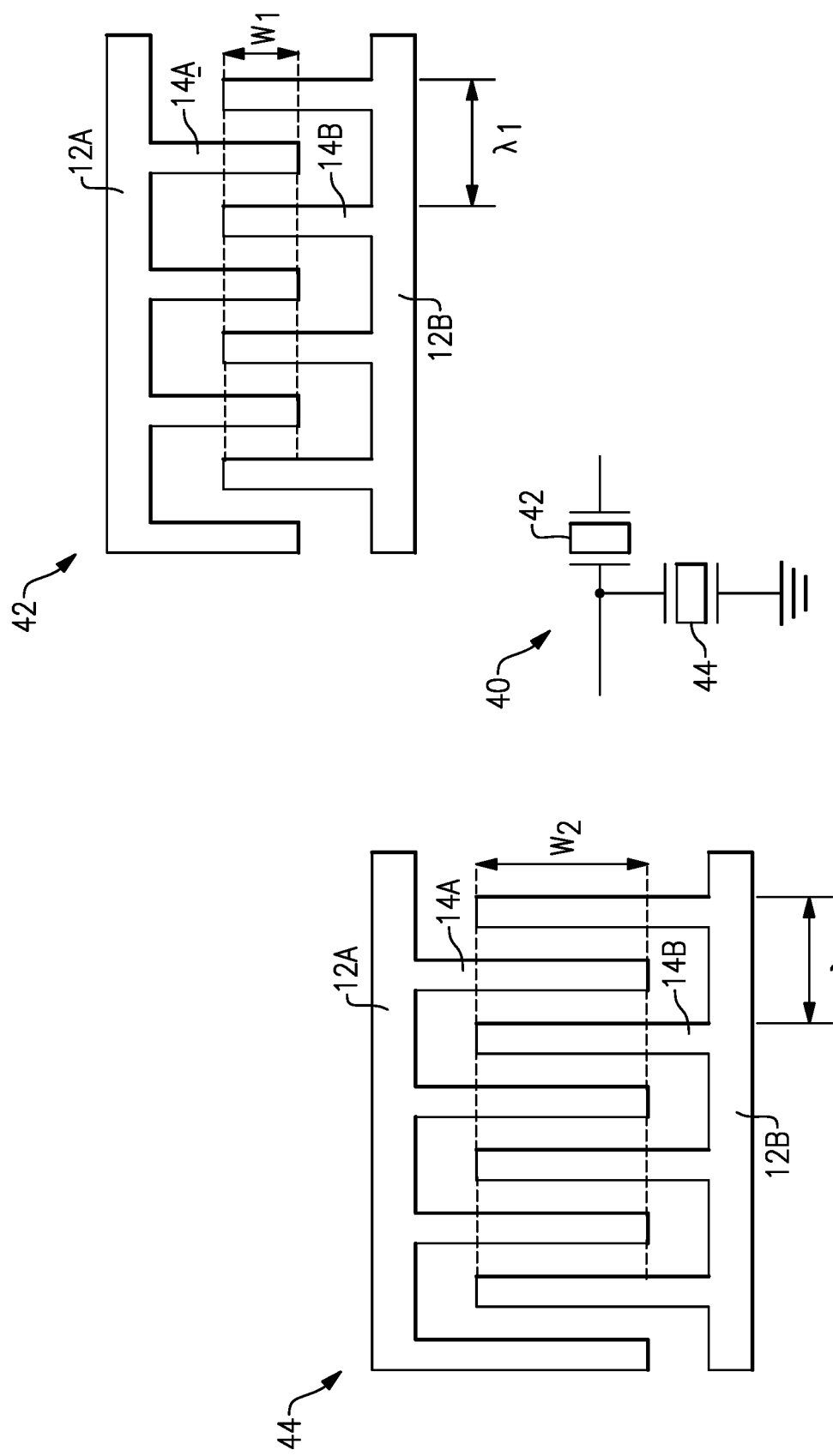
FIG. 4 illustrates a stage of a ladder filter with a series acoustic wave resonator having an IDT electrode with a smaller aperture than a shunt acoustic wave resonator according to an embodiment.

FIG. 4 illustrates a filter stage 40 of a ladder filter according to an embodiment. The filter stage 40 includes a shunt acoustic wave resonator 44 and a series acoustic wave resonator 42. FIG. 4 includes a schematic diagram of the filter stage 40 and also illustrates IDT electrodes of the shunt acoustic wave resonator 44 and the series acoustic wave resonator 42. The series acoustic wave resonator 42 and the shunt acoustic wave resonator 44 can be SAW resonators. The filter stage 40 can implement any suitable filter stage of the ladder filter 30 of FIG. 3 in various applications. One or more filter stages 40 can be included in the ladder filter 30 of FIG. 3 in certain instances. A ladder filter can be formed of a plurality of filter stages 40. FIG. 4 includes a schematic diagram of the filter stage 40 and also illustrates IDT electrodes of the shunt acoustic wave resonator 44 and the series acoustic wave resonator 42.

In the filter stage 40, the series acoustic wave resonator 42 includes a relatively narrow aperture. Such an aperture can concentrate a transverse spurious mode in frequency. The transverse spurious mode can be concentrated at a frequency above the resonant frequency of the series acoustic wave resonator 42. The series acoustic wave resonator 42 does not include a piston mode structure. As illustrated in FIG. 4, the IDT electrode of the series acoustic wave resonator 42 has a pitch of $\lambda_1$ and an aperture of $W_1$. The aperture $W_1$ is relatively narrow. For example, the aperture $W_1$ can be less than $10\lambda_1$. In some instances, the aperture $W_1$ can be less than $7\lambda_1$. The aperture $W_1$ can be in a range from $1\lambda_1$ to $10\lambda_1$, such as in a range from $1\lambda_1$ to $7\lambda_1$. In certain applications where resistance of the series acoustic wave resonator 42 is a primary consideration, the aperture $W_1$ can be as narrow as $1\lambda_1$. The aperture $W_1$ can be in a range from $3\lambda_1$ to $10\lambda_1$, such as in a range from $3\lambda_1$ to $7\lambda_1$. In certain instances, having the aperture of $W_1$ of at least $3\lambda$ can reduce and/or eliminate diffraction issues associated with even narrower apertures.

The IDT electrode of the shunt acoustic wave resonator 44 has a pitch of $\lambda_2$ and an aperture of $W_2$. As shown in FIG. 4, the shunt acoustic wave resonator 44 has a wider IDT electrode aperture $W_2$ than the IDT electrode aperture $W_1$ of the series acoustic wave resonator 42. The IDT electrode aperture $W_2$ of the shunt acoustic wave resonator 44 can be in a range from about $15\lambda_2$ to $30\lambda_2$. The IDT electrode aperture $W_2$ of one or more other shunt acoustic wave resonators in the same filter as the shunt acoustic wave resonator 44 can be in a range from about $15\lambda_1$ to $30\lambda_1$. The shunt acoustic wave resonator 44 can include a piston mode structure (not illustrated in the view of the IDT electrode of the shunt acoustic wave resonator 44) to suppress transverse spurious modes. The piston mode structure can be positioned above the IDT electrode in certain applications. The piston mode structure can include a silicon nitride layer with trenches in some instances. Alternatively or additionally, the piston mode structure can include a mass loading strip (e.g., a conductive strip) over end portions of IDT electrode fingers. Example piston mode structures are disclosed in U.S. patent application Ser. No. 16/723,990 filed Dec. 20, 2019, the disclosure of which is hereby incorporated by reference in its entirety for all purposes.

Figure 5A:
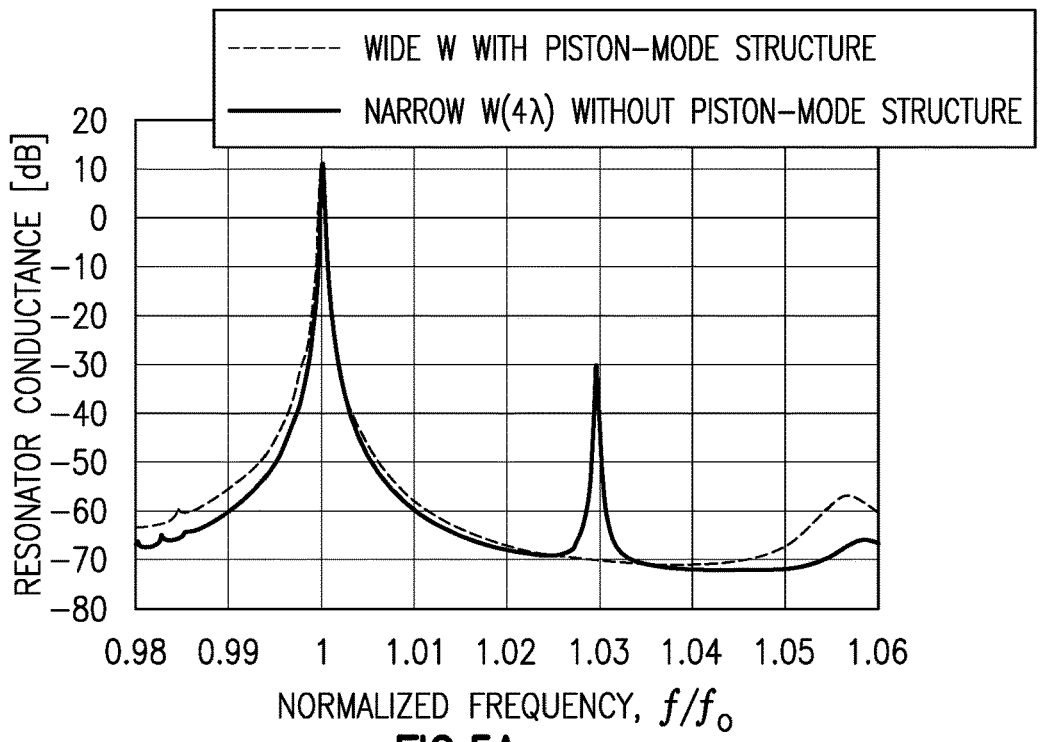
FIG. 5A is a graph of resonator conductance versus normalized frequency for a series surface acoustic wave resonator with the IDT electrode of FIG. 4B compared to a similar series surface acoustic wave resonator with a wider aperture and a piston mode structure.

FIG. 5A is a graph of resonator conductance versus normalized frequency for the series surface acoustic wave resonator 42 of FIG. 4 compared to a similar series surface acoustic wave resonator with a wider aperture and a piston mode structure. The normalized frequency represents a ratio of frequency over resonant frequency. FIG. 5A shows that the series acoustic wave resonator 42 with the narrow aperture and without a piston mode structure has a relatively strong transverse spurious mode at a normalized frequency of approximately 1.03. Instead of suppressing transverse spurious modes like a series acoustic wave resonator with the piston mode structure, the series acoustic wave resonator 42 concentrates a transverse spurious mode in frequency. The quality factor (Q) of the transverse spurious mode of the series acoustic wave resonator 42 is relatively high. The transverse spurious mode of the series acoustic wave resonator is outside of a pass band of a filter that includes the filter stage 40.

Figure 5B:
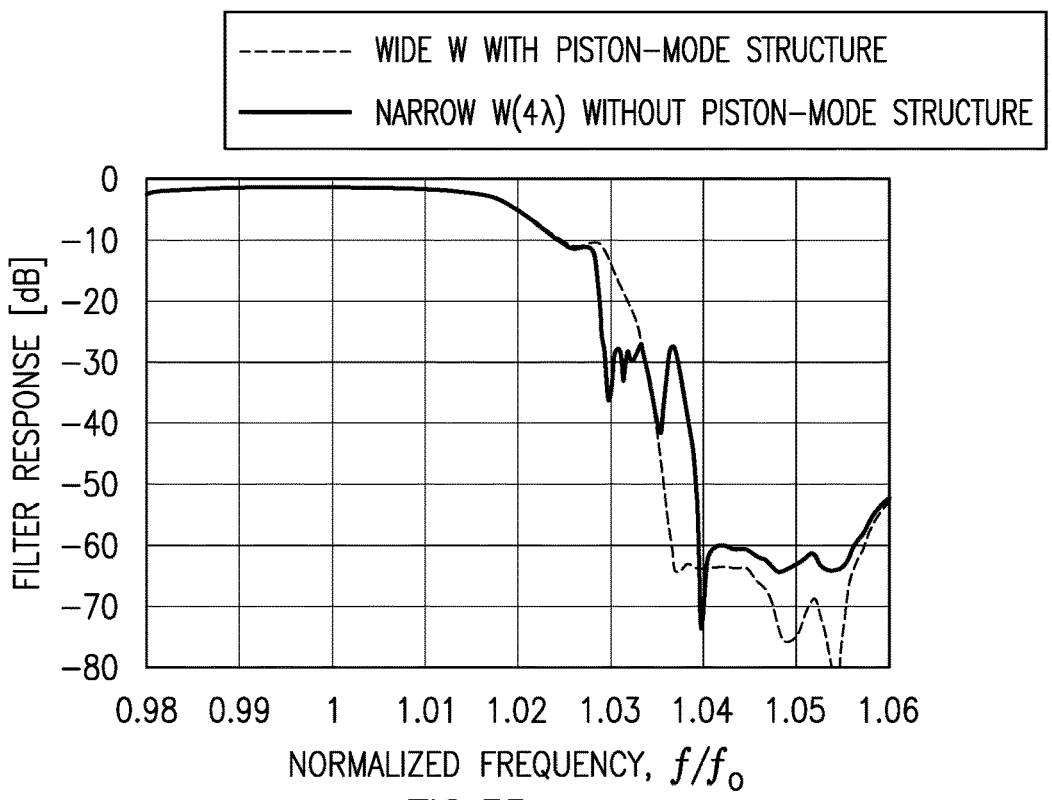
FIG. 5B is a graph of filter response versus normalized frequency for a ladder filter that includes series surface acoustic wave resonators with the IDT electrodes of FIG. 4B compared to a ladder filter that includes similar series surface acoustic wave resonators with piston mode structures.

FIG. 5B is a graph of filter response versus normalized frequency for a ladder filter that includes series surface acoustic wave resonators 42 of FIG. 4 with relatively narrow IDT electrode apertures and without piston mode structures compared to a ladder filter that includes similar series surface acoustic wave resonators with wider IDT electrode apertures and piston mode structures. Both simulated ladder filters include shunt acoustic wave resonators 44 with wider IDT electrode apertures and piston mode structures. The simulation of FIG. 5B corresponds to the ladder filter 30 of FIG. 3 where all series acoustic wave resonators 32A to 32D are SAW resonators with an IDT electrode having an aperture of $4\lambda$ and without piston mode structures. Each of these series acoustic wave resonators can have a conductance similar to the conductance shown in FIG. 5A.

The transverse spurious mode of the series acoustic wave resonators 42 can improve steepness of the skirt of the filter response. For example, the transverse spurious mode at a normalized frequency of approximately 1.03 shown in FIG. 5A can result in an improved steepness in the filter response at a normalized frequency of approximately 1.03 relative to the ladder filter that includes similar series surface acoustic wave resonators with wider IDT electrode apertures and piston mode structures as shown in FIG. 5B. Accordingly, a series acoustic wave resonator 42 can contribute to a steeper filter skirt. Thus, a sufficiently steep filter skirt can be achieved in a ladder filter with one or more series acoustic wave resonators 42 without adding other circuit component (s) to a ladder filter. A steep filter skirt can contribute to relatively low insertion loss in a passband. Low loss can be particularly desirable for certain transmit filters.

Figure 6:
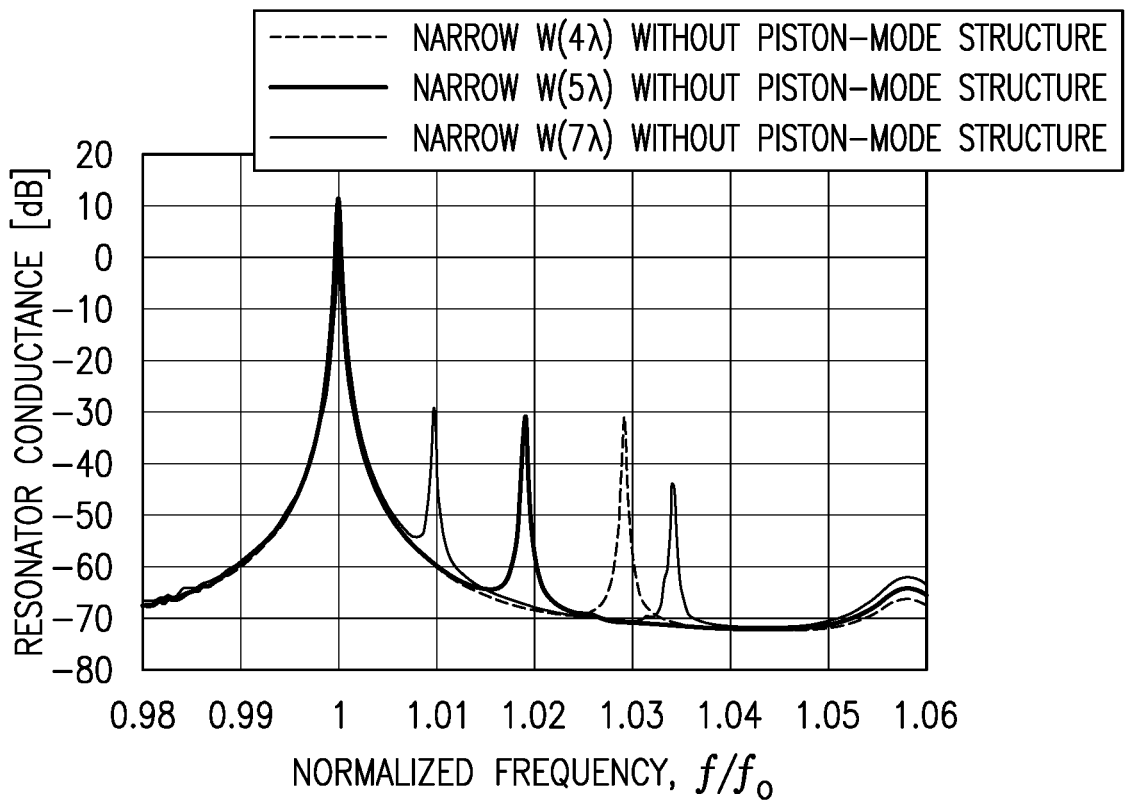
FIG. 6 is a graph of resonator conductance versus normalized frequency for different acoustic apertures of a surface acoustic wave device with the IDT electrode of FIG. 4B.

FIG. 6 is a graph of resonator conductance versus normalized frequency for different acoustic apertures of a surface acoustic wave device with the IDT electrode of the series acoustic wave resonator 42 of FIG. 4. FIG. 6 illustrates that frequency of the transverse mode can be controlled by IDT electrode aperture width. The transverse mode frequency can correspond to an attenuation pole. FIG. 6 shows resonator conductance over normalized frequency IDT electrode apertures $W_1$ of the series acoustic wave resonator 42 of FIG. 4 of $4\lambda$, $5\lambda$, and $7\lambda$ for the series surface acoustic wave resonator 42. In FIG. 6, transverse modes above the resonant frequency of the series acoustic wave resonator 42 are shown in the graph.

A larger IDT electrode aperture can result in additional transverse spurious modes. For example, an IDT electrode aperture $W_1$ of 7λ can result in two transverse modes while IDT electrode apertures $W_1$ of 4λ and 5λ can result in one transverse spurious mode. In some instances, concentrating the transverse spurious mode at one frequency instead of two frequencies can be preferred. In such instances, an IDT electrode aperture $W_1$ of less 7λ can be desirable.

A narrower IDT electrode aperture can result in a transverse spurious mode farther from a resonant frequency. By adjusting the IDT electrode aperture $W_1$, a transverse spurious mode can be adjusted in frequency. The IDT electrode aperture $W_1$ can be selected such that the transverse spurious mode corresponds to a frequency where a steeper edge of a pass band and/or a steeper filter skirt is desired. In some instances, a transverse mode for the IDT electrode aperture $W_1$ of 7λ can to too close to the resonant frequency to be outside of a passband of a filter that includes the surface acoustic wave resonator. In such instances, an IDT electrode aperture $W_1$ of less 7λ can be desirable. Alternatively, for filter responses with a relatively narrow pass band, an IDT electrode aperture $W_1$ of around 7λ can advantageously improve skirt steepness.

Figure 7:
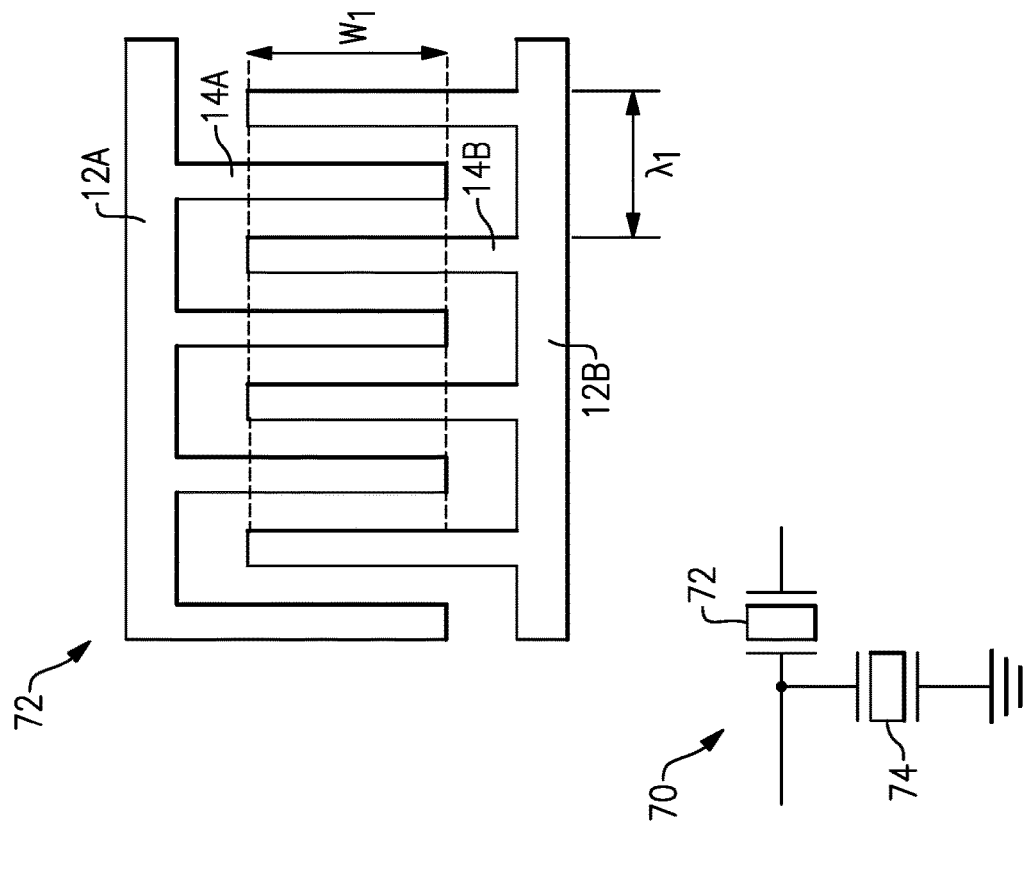
FIG. 7 illustrates a stage of a ladder filter with a shunt acoustic wave resonator having an IDT electrode with a smaller aperture than a series acoustic wave resonator according to an embodiment.
Figure 7:
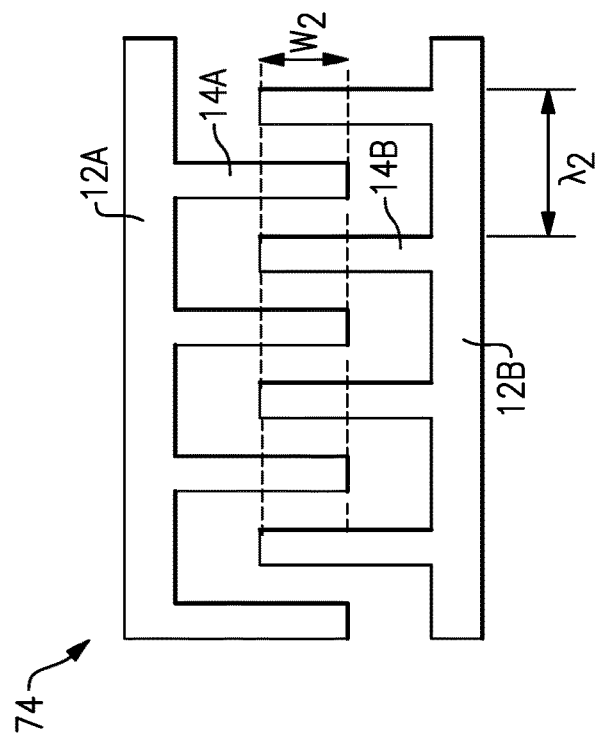

FIG. 7 illustrates a filter stage 70 of a ladder filter according to an embodiment. The filter stage 70 includes a shunt acoustic wave resonator 74 and a series acoustic wave resonator 72. FIG. 7 includes a schematic diagram of the filter stage 70 and also illustrates IDT electrodes of the shunt acoustic wave resonator 74 and the series acoustic wave resonator 72. The series acoustic wave resonator 72 and the shunt acoustic wave resonator 74 can be SAW resonators. The filter stage 70 can implement any suitable filter stage of the ladder filter 30 of FIG. 3 in various applications. One or more filter stages 70 can be included in the ladder filter 30 of FIG. 3 in certain instances. A ladder filter can be formed of a plurality of filter stages 70.

In the filter stage 70, the shunt acoustic wave resonator 74 includes a relatively narrow IDT electrode aperture. Such an aperture can concentrate a transverse spurious mode in frequency. The transverse spurious mode can be concentrated at a frequency above the resonant frequency of the shunt acoustic wave resonator 74. The shunt acoustic wave resonator 74 does not include a piston mode structure. As illustrated in FIG. 7, the IDT electrode of the shunt acoustic wave resonator 74 has a pitch of $\lambda_2$ and an aperture of $W_2$. The aperture $W_2$ is relatively narrow. For example, the aperture $W_2$ can be less than $10\lambda_2$. In some instances, the aperture $W_2$ can be less than $7\lambda_2$. In certain applications, the aperture $W_2$ can be in a range from $1\lambda_2$ to $10\lambda_2$, such as in a range from $1\lambda_2$ to $7\lambda_2$. In some other applications, the aperture $W_2$ can be in a range from $3\lambda_2$ to $10\lambda_2$, such as in a range from $3\lambda_2$ to $7\lambda_2$.

The IDT electrode of the series acoustic wave resonator 72 has a pitch of $\lambda_1$ and an aperture of $W_1$. As shown in FIG. 7, the series acoustic wave resonator 72 has a wider IDT electrode aperture $W_1$ than the IDT electrode aperture $W_2$ of the shunt acoustic wave resonator 74. The IDT electrode aperture $W_1$ of the series acoustic wave resonator 72 can be in a range from about $15\lambda_1$ to $30\lambda_1$. The IDT electrode aperture $W_1$ of the series acoustic wave resonator 72 can be in a range from about $15\lambda_2$ to $30\lambda_2$. The series acoustic wave resonator 72 can include a piston mode structure (not illustrated in the view of the IDT electrode of the series acoustic wave resonator 72) to suppress transverse spurious modes. The piston mode structure can be positioned above the IDT electrode in certain applications. The piston mode structure can include a silicon nitride layer with trenches in some instances. Alternatively or additionally, the piston mode structure can include a conductive strip over end portions of IDT electrode fingers.

Figure 8A:
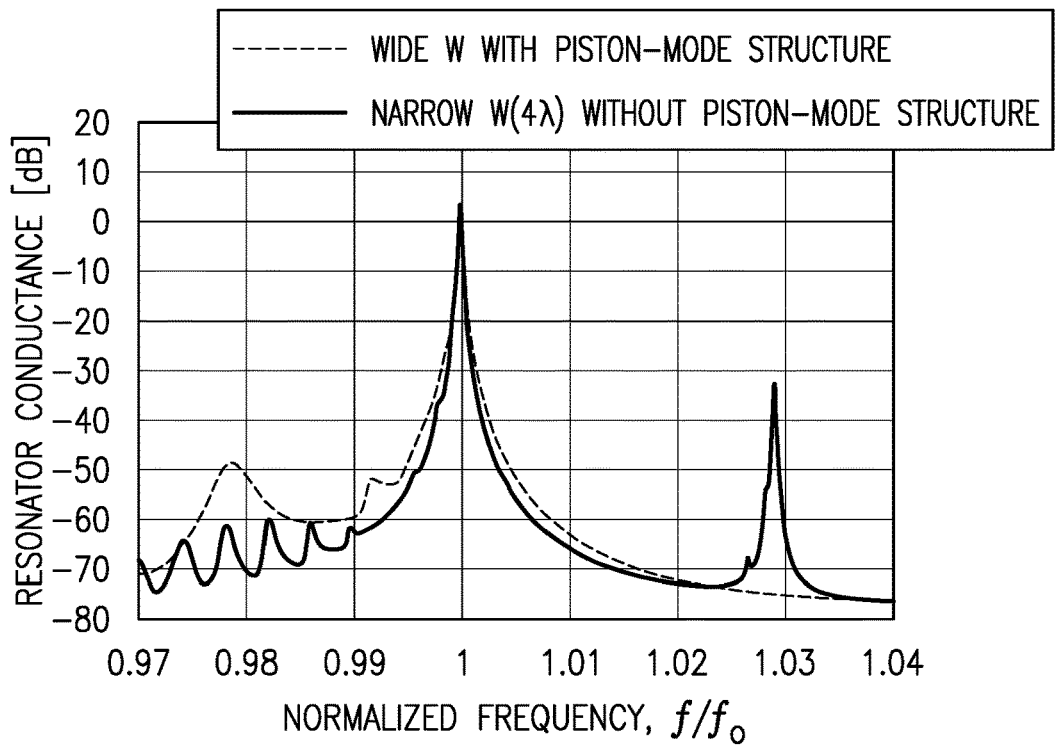
FIG. 8A is a graph of resonator conductance versus normalized frequency for a shunt surface acoustic wave resonator with the IDT electrode of FIG. 7B compared to a similar shunt surface acoustic wave resonator with a piston mode structure.

FIG. 8A is a graph of resonator conductance versus normalized frequency for the shunt surface acoustic wave resonator 74 with the IDT electrode of FIG. 7 compared to a similar series surface acoustic wave resonator with a wider aperture and a piston mode structure. FIG. 8A shows that the shunt surface acoustic wave resonator 74 with the narrow aperture and without a piston mode structure has a relatively strong transverse spurious mode at a normalized frequency of approximately 1.03.

Figure 8B:
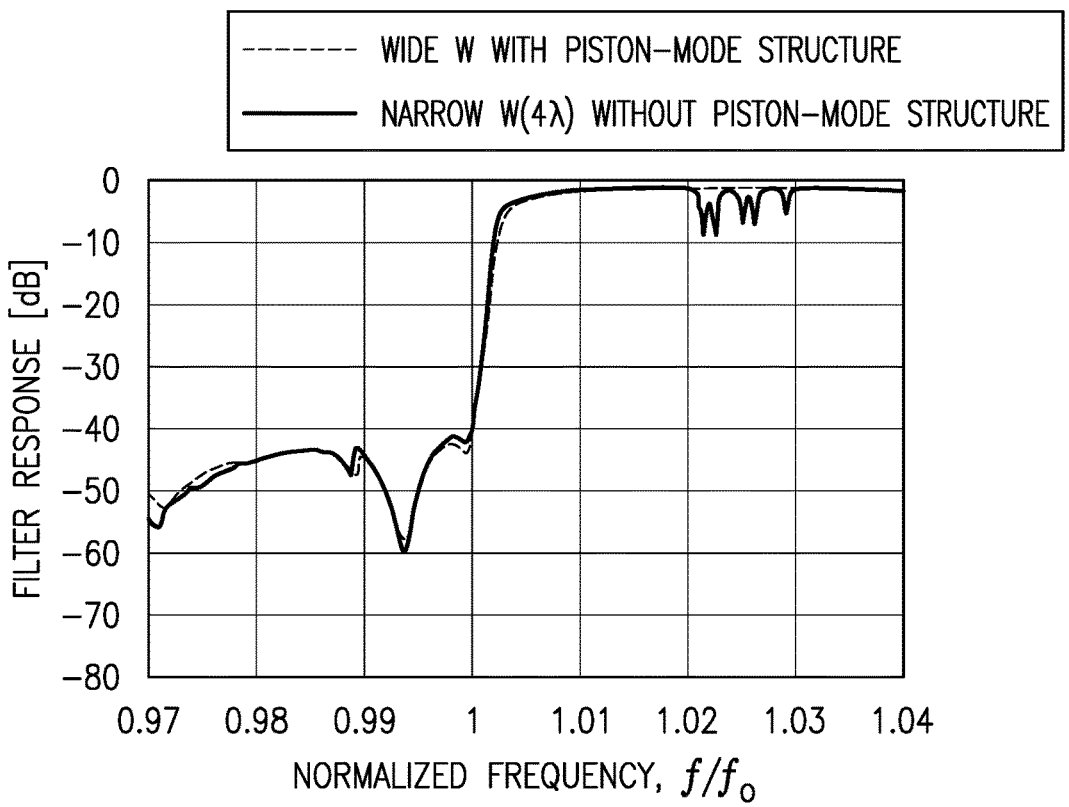
FIG. 8B is a graph of filter response versus normalized frequency for a ladder filter that includes shunt surface acoustic wave resonators with the IDT electrodes of FIG. 7B compared to a ladder filter that includes similar shunt surface acoustic wave resonators with piston mode structures.

FIG. 8B is a graph of filter response versus normalized frequency for a ladder filter that includes shunt surface acoustic wave resonators 74 of FIG. 7 with relatively narrow IDT electrode apertures and without piston mode structures compared to a ladder filter that includes similar shunt surface acoustic wave resonators with wider IDT electrode apertures and piston mode structures. Both simulated ladder filters include series acoustic wave resonators 72 with wider IDT electrode apertures and piston mode structures.

The simulation of FIG. 8B corresponds to the ladder filter 30 of FIG. 3 where all shunt acoustic wave resonators 34A to 34D are SAW resonators with an IDT electrode having an aperture of 4λ and without piston mode structures. Each of these shunt surface acoustic wave resonators can have a conductance similar to the conductance shown in FIG. 8A.

The transverse spurious mode of the shunt acoustic wave resonators can be within the passband of the filter as shown in FIG. 8B. This can create one or more ripples in the filter passband. When the concentrated transverse spurious mode is at a frequency within a passband of a filter, the transverse spurious mode should not improve skirt steepness.

A shunt acoustic wave resonator 74 with a transverse spurious mode concentrated at a frequency can improve filter skirt steepness for filters with a relatively narrow pass band. For example, in filters with a passband that is narrower than about 3% of a resonant frequency of the shunt acoustic wave resonator 74, the shunt acoustic wave resonator 74 with a conductance shown in FIG. 8A can contribute to a steeper filter skirt. Thus, a steep filter skirt can be achieved in a ladder filter with one or more shunt acoustic wave resonators 74 without adding other circuit component(s) to a ladder filter.

Table 1 below includes information about Long Term Evolution (LTE) frequency bands with relatively narrow passbands in which one or more shunt resonators with a relatively narrow aperture and without a piston mode structure can contribute to a steeper filter skirt. In particular, Table 1 shows bandwidth (BW), center frequency (f_center), and a ratio of bandwidth over center frequency (RBW) for certain LTE frequency bands with relatively narrow BW.

TABLE 1

| Band | BW (MHz) | f_center (MHz) | RBW % |
| --- | --- | --- | --- |
| B12Tx | 17 | 707.5 | 2.4 |
| B13Tx | 10 | 782 | 1.3 |
| B14Tx | 10 | 793 | 1.3 |
| B30Tx | 10 | 2310 | 0.4 |

Figure 9:
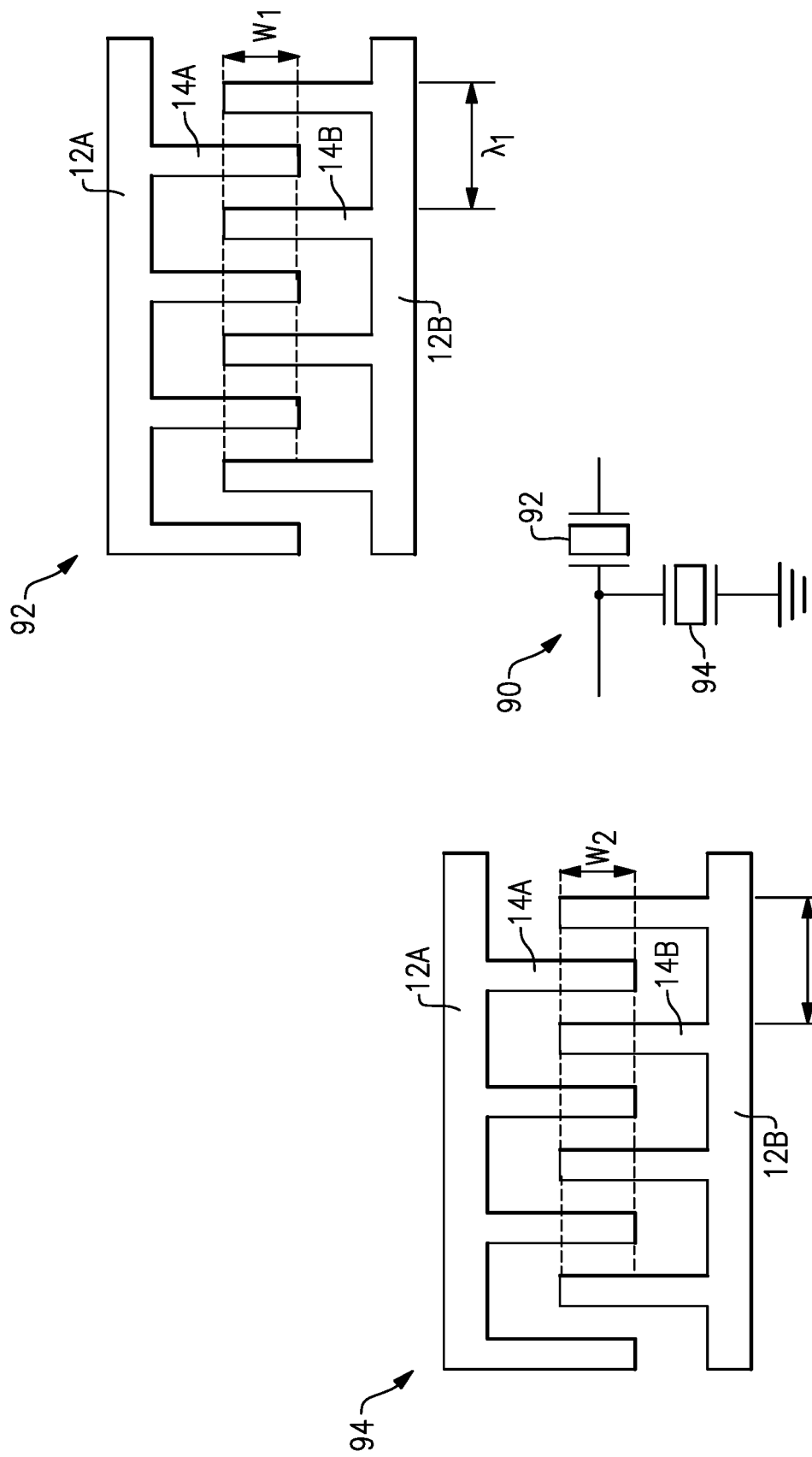
FIG. 9 illustrates a stage of a ladder filter with a series acoustic wave resonator and a shunt acoustic wave resonator both having narrow IDT electrode apertures according to an embodiment.

FIG. 9 illustrates a filter stage 90 of a ladder filter with a series acoustic wave resonator 92 and a shunt acoustic wave resonator 94 both having narrow IDT apertures according to an embodiment. The series acoustic wave resonator 92 can implemented in accordance with any suitable principles and advantages of the series acoustic wave resonator 42 of FIG. 4. The shunt acoustic wave resonator 94 can implemented in accordance with any suitable principles and advantages of the shunt acoustic wave resonator 74 of FIG. 7.

An acoustic wave resonator having a relatively narrow IDT electrode aperture and without a piston mode structure can be a SAW resonator. Example SAW resonators will be discussed with reference to FIGS. 10 to 12. Any suitable combination of features of these SAW resonators can be implemented in accordance with each other and/or any other embodiments disclosed herein.

Figure 10:
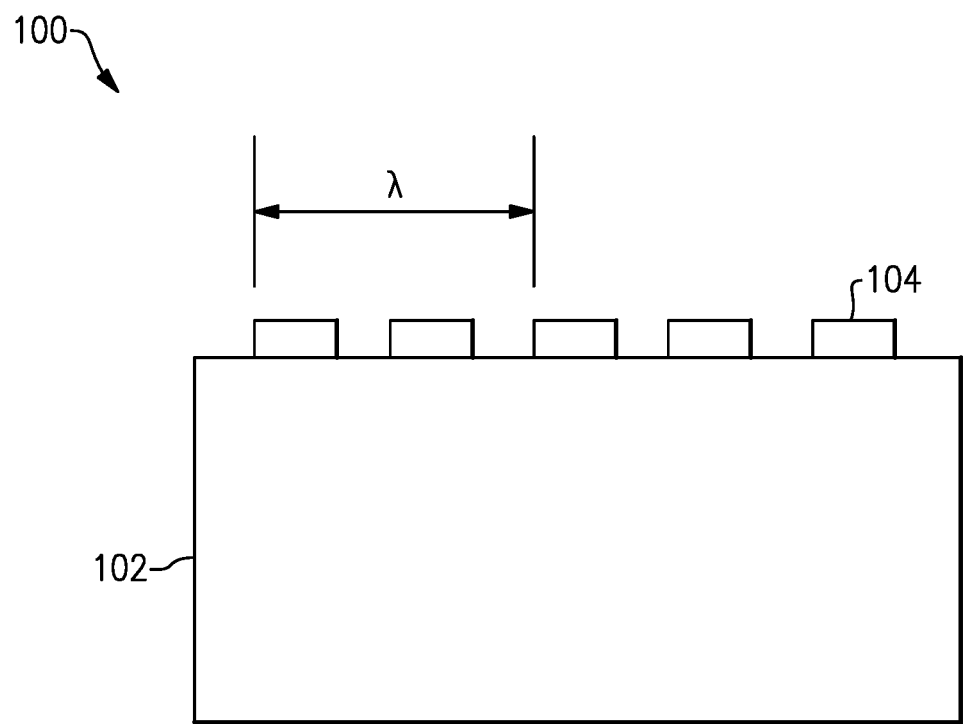
FIG. 10 is a diagram of a cross section of a SAW resonator according to an embodiment.

FIG. 10 is a diagram of a cross section of a SAW resonator 100 according to an embodiment. The SAW resonator 100 is an example of an acoustic wave resonator that can have a relatively narrow IDT electrode aperture. The SAW resonator 100 is an example of a non-temperature compensated SAW resonator. SAW filters disclosed herein can include any suitable number of SAW resonators 100. The illustrated SAW resonator 100 includes a piezoelectric layer 102 and an IDT electrode 104 on the piezoelectric layer 102. The piezoelectric layer 102 can be a lithium niobate layer or a lithium tantalate layer, for example. The IDT electrode 104 can have a relatively narrow aperture to concentrate a transverse spurious mode in frequency. The IDT electrode 104 can be implemented in accordance with any suitable principles and advantages of the IDT electrode with a narrow aperture disclosed herein. The SAW resonator 100 can be included as a series resonator in a filter to improve filter skirt steepness. The SAW resonator 100 can be included as a shunt resonator in a filter to improve filter skirt steepness.

A relatively high density IDT electrode, such as tungsten (W) IDT electrode, can create technical challenges in a temperature-compensated SAW (TCSAW) resonator. Transverse mode suppression can be significant for TCSAW device performance. Including a relatively narrow IDT electrode aperture in accordance with the principles and advantages disclosed herein can achieve desirable performance in acoustic wave filters that include TCSAW resonator(s).

Figure 11:
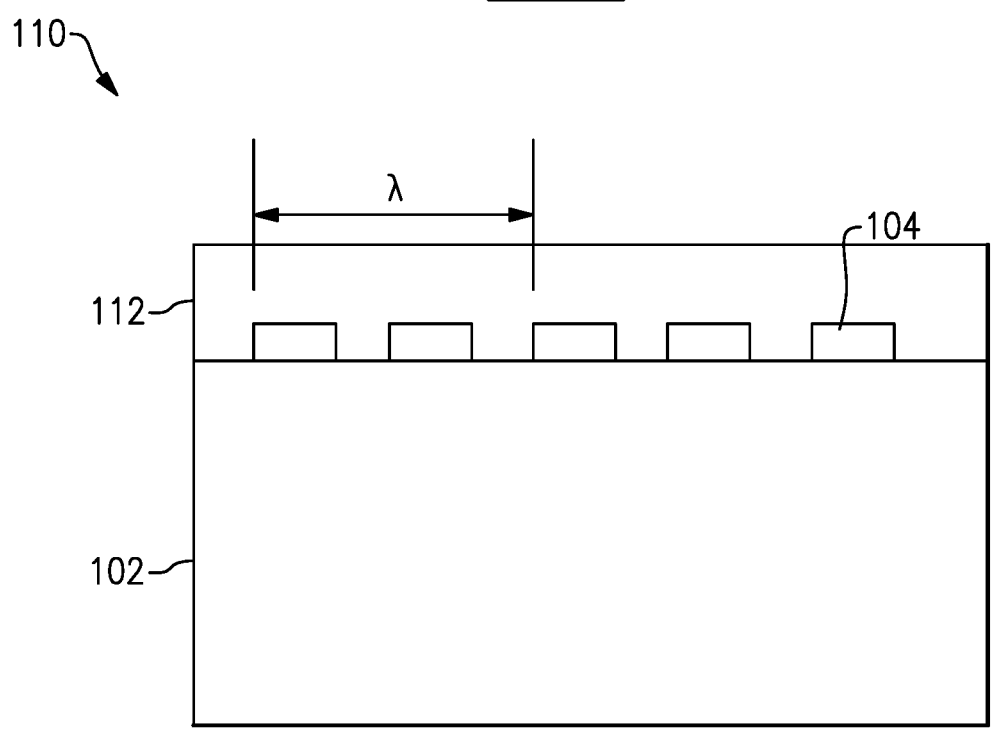
FIG. 11 is a diagram of a cross section of a temperature compensated SAW resonator according to an embodiment.

FIG. 11 is a diagram of a cross section of a temperature compensated SAW (TCSAW) resonator 110 according to an embodiment. The TCSAW resonator 110 is an example of an acoustic wave resonator that can have a relatively narrow IDT electrode aperture. SAW filters disclosed herein can include any suitable number of TCSAW resonators 110. The illustrated TCSAW resonator 110 includes a piezoelectric layer 102, an IDT electrode 104 on the piezoelectric layer 102, and a temperature compensation layer 112 over the IDT electrode 104. The piezoelectric layer 102 can be a lithium niobate substrate or a lithium tantalate substrate, for example. The IDT electrode 104 can have a relatively narrow aperture to concentrate a transverse spurious mode in frequency. The IDT electrode 104 can be implemented in accordance with any suitable principles and advantages of the IDT electrode with a narrow aperture disclosed herein. The SAW resonator 110 can be included as a series resonator in a filter to improve filter skirt steepness. The SAW resonator 110 can be included as a shunt resonator in a filter to improve filter skirt steepness.

The temperature compensation layer 112 can bring the temperature coefficient of frequency (TCF) of the TCSAW resonator 110 closer to zero relative to a similar SAW resonator without the temperature compensation layer 112. The temperature compensation layer 112 can have a positive TCF. This can compensate for the piezoelectric layer 102 having a negative TCF. The temperature compensation layer 112 can be a silicon dioxide ($SiO_2$) layer. The temperature compensation layer 112 can include any other suitable temperature compensating material including without limitation a tellurium dioxide ($TeO_2$) layer or a silicon oxyfluoride (SiOF layer). The temperature compensation layer 112 can include any suitable combination of $SiO_2$, $TeO_2$, and/or SiOF.

FIG. 12 is a diagram of a cross section of a multilayer piezoelectric substrate (MPS) SAW resonator 120 according to an embodiment. The MPS SAW resonator 120 is an example of an acoustic wave resonator that can have a relatively narrow IDT aperture. SAW filters disclosed herein can include any suitable number of MPS SAW resonators 120. The illustrated MPS SAW resonator 120 includes a multilayer piezoelectric substrate including a piezoelectric layer 102 and a support substrate 122. The MPS SAW resonator 120 also includes an IDT electrode 104 on the piezoelectric layer 102.

The piezoelectric layer 102 can be a lithium niobate substrate or a lithium tantalate substrate, for example. In certain instances, the piezoelectric layer 102 can have a thickness of less than $\lambda$, in which $\lambda$ is a wavelength of a surface acoustic wave generated by the MPS SAW resonator 120. In some other instances, the piezoelectric layer 102 can have a thickness on the order of 10 s of $\lambda$, in which $\lambda$ is a wavelength of a surface acoustic wave generated by the MPS SAW resonator 120. The thickness of the piezoelectric layer 102 can be in a range from about 20 microns to 30 microns in certain applications. The support substrate 122 can be a silicon substrate, a quartz substrate, a sapphire substrate, a polycrystalline spinel substrate, or any other suitable carrier substrate. As one example, the MPS SAW resonator 120 can include a piezoelectric substrate 102 that is lithium tantalate and a support substrate 114 that is silicon.

In some instances (not illustrated), one or more additional layers can be included in the multilayer piezoelectric substrate of an MPS SAW resonator. Non-limiting examples of a layer of the one or more additional layers include a silicon dioxide layer, a silicon nitride layer, an aluminum nitride layer, an adhesion layer, a dispersion adjustment layer, and a thermal dissipation layer. As an illustrative example, a multilayer piezoelectric substrate can include a lithium tantalate layer over a silicon dioxide layer over an aluminum nitride layer over a silicon layer. As one more illustrative example, a multilayer piezoelectric substrate can include a lithium niobate layer over a silicon dioxide layer over a high impedance layer, in which the high impedance layer has a higher acoustic impedance than the lithium niobate layer.

In the MPS SAW resonator 120, the IDT electrode 104 can have a relatively narrow aperture to concentrate a transverse spurious mode in frequency. The IDT electrode 104 can be implemented in accordance with any suitable principles and advantages of the IDT electrode with a narrow aperture disclosed herein. The MPS SAW resonator 120 can be included as a series resonator in a filter to improve filter skirt steepness. The MPS SAW resonator 120 can be included as a shunt resonator in a filter to improve filter skirt steepness.

A method of filtering a radio frequency signal according to an embodiment will now be described. The method includes providing a radio frequency signal to an acoustic wave filter with an acoustic wave resonator that includes an interdigital transducer electrode and configured to generate an acoustic wave having a wavelength of $\lambda$. The interdigital transducer electrode has an aperture of less than $10\lambda$ to concentrate a transverse spurious mode at a frequency. The acoustic wave resonator can include any suitable combination of features of the acoustic wave resonators disclosed herein. The method also includes filtering the radio frequency signal with the acoustic wave filter in which the transverse spurious mode of the acoustic wave resonator improves steepness of a skirt of the acoustic wave filter.

Although some embodiments discussed herein are described with references to SAW resonators, any suitable principles and advantages of acoustic wave resonators with relatively narrow aperture disclosed herein can be applied to any other type of acoustic wave resonator with an IDT electrode, such as a Lamb wave resonator or a boundary acoustic wave resonator.

Acoustic wave resonators having a relatively narrow IDT electrode aperture and without a piston mode structure can be implemented in a variety of different filters. Example filters include without limitation ladder filters, lattice filters, and hybrid filters that include a topology that is combination of ladder filter and lattice filter topologies.

An acoustic wave filter including any suitable combination of features disclosed herein be arranged to filter a radio frequency signal in a fifth generation (5G) New Radio (NR) operating band within Frequency Range 1 (FR1). FR1 can be from 410 MHz to 7.125 GHz, for example, as specified in a current 5G NR specification. An acoustic wave filter with increased skirt steepness in accordance with any suitable principles and advantages disclosed herein can be arranged to filter a radio frequency signal in a 5G NR FR1. In 5G applications, there is a desired for steeper passband edges. Acoustic wave filters disclosed herein can achieve sufficiently steep passband edges to meet stringent 5G specifications. An acoustic wave filter in accordance with any suitable principles and advantages disclosed herein can be arranged to filter a radio frequency signal in a fourth generation (4G) Long Term Evolution (LTE) operating band. An acoustic wave filter in accordance with any suitable principles and advantages disclosed herein can have a passband that includes a 4G LTE operating band and a 5G NR operating band.

Acoustic wave filters with increased skirt steepness disclosed herein can be implemented in multiplexers. A multiplexer can include a plurality of acoustic wave filters coupled together at a common node. Examples of multiplexers include but are not limited to a duplexer with two filters coupled together at a common node, a triplexer with three filters coupled together at a common node, a quadplexer with four filters coupled together at a common node, a hexaplexer with six filters coupled together at a common node, an octoplexer with eight filters coupled together at a common node, or the like. One or more filters of a multiplexer can include an acoustic wave resonator with a relatively narrow IDT electrode aperture to concentrate a transverse spurious mode in accordance with any suitable principles and advantages disclosed herein.

FIG. 13A is a schematic diagram of a duplexer 130 that includes an acoustic wave filter according to an embodiment. The duplexer 130 includes a first filter 132 and a second filter 134 coupled to together at a common node COM. One of the filters of the duplexer 130 can be a transmit filter and the other of the filters of the duplexer 130 can be a receive filter. The transmit filter and the receive filter can be respective ladder filters with acoustic wave resonators having a topology similar to the ladder filter 30 of FIG. 3. In some other instances, such as in a diversity receive application, the duplexer 130 can include two receive filters. The duplexer 130 can alternatively include tow transmit filters. The common node COM can be an antenna node.

The first filter 132 is an acoustic wave filter arranged to filter a radio frequency signal. The first filter 132 can include acoustic wave resonators coupled between a first radio frequency node RF1 and the common node. The first radio frequency node RF1 can be a transmit node or a receive node. The first filter 132 includes at least one acoustic wave resonator with a relatively narrow IDT electrode aperture in accordance with any suitable principles and advantages disclosed herein.

The second filter 134 can be any suitable filter arranged to filter a second radio frequency signal. The second filter 134 can be, for example, an acoustic wave filter, an acoustic wave filter that includes at least one acoustic wave resonator with a relatively narrow IDT electrode aperture, an LC filter, a hybrid acoustic wave LC filter, or the like. The second filter 134 is coupled between a second radio frequency node RF2 and the common node. The second radio frequency node RF2 can be a transmit node or a receive node.

FIG. 13B is a schematic diagram of a multiplexer 135 that includes an acoustic wave filter according to an embodiment. The multiplexer 135 includes a plurality of filters 132 to 136 coupled together at a common node COM. The plurality of filters can include any suitable number of filters including, for example, 3 filters, 4 filters, 5 filters, 6 filters, 7 filters, 8 filters, or more filters. Some or all of the plurality of acoustic wave filters can be acoustic wave filters.

The first filter 132 is an acoustic wave filter arranged to filter a radio frequency signal. The first filter 132 can include acoustic wave resonators coupled between a first radio frequency node RF1 and the common node. The first radio frequency node RF1 can be a transmit node or a receive node. The first filter 132 includes at least one acoustic wave resonator with a relatively narrow IDT electrode aperture in accordance with any suitable principles and advantages disclosed herein. The other filter(s) of the multiplexer 135 can include one or more acoustic wave filters, one or more acoustic wave filters that include at least one acoustic wave resonator with a relatively narrow IDT electrode aperture, one or more LC filters, one or more hybrid acoustic wave LC filters, or any suitable combination thereof.

The acoustic wave resonators disclosed herein can be implemented in a variety of packaged modules. Some example packaged modules will now be disclosed in which any suitable principles and advantages of the acoustic wave filters and/or acoustic wave resonators disclosed herein can be implemented. The example packaged modules can include a package that encloses the illustrated circuit elements. A module that includes a radio frequency component can be referred to as a radio frequency module. The illustrated circuit elements can be disposed on a common packaging substrate. The packaging substrate can be a laminate substrate, for example. FIGS. 14 to 18 are schematic block diagrams of illustrative packaged modules according to certain embodiments. Any suitable combination of features of these packaged modules can be implemented with each other. While duplexers are illustrated in the example packaged modules of FIGS. 15, 16, and 18, any suitable stand-alone filter or other suitable multiplexer that includes a plurality of filters coupled to a common node can be implemented instead of one or more duplexers. For example, a quadplexer can be implemented in certain applications. Alternatively or additionally, one or more filters of a packaged module can be arranged as a transmit filter or a receive filter that is not included in a multiplexer.

Figure 14:
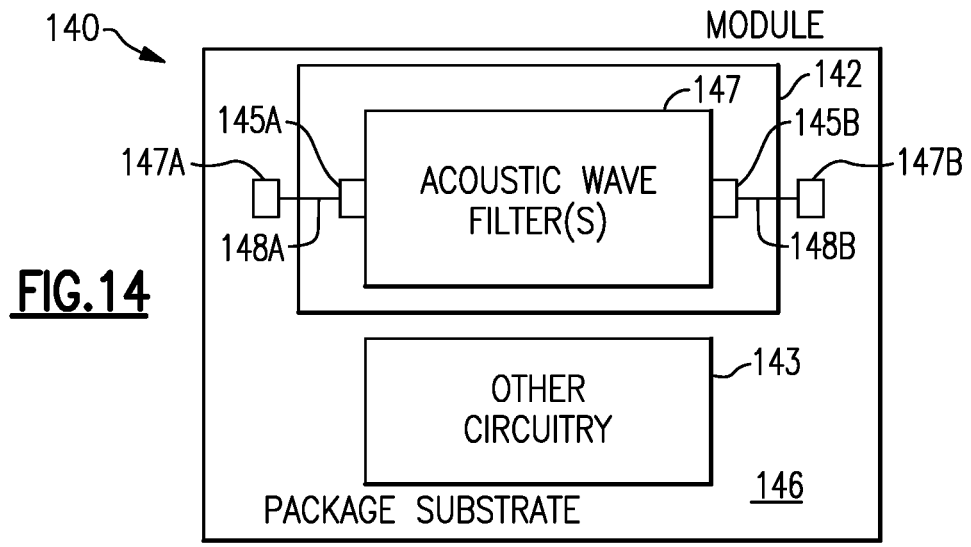
FIG. 14 is a schematic diagram of a radio frequency module that includes an acoustic wave filter according to an embodiment.

FIG. 14 is a schematic diagram of a radio frequency module 140 that includes an acoustic wave component 142 according to an embodiment. The illustrated radio frequency module 140 includes the acoustic wave component 142 and other circuitry 143. The acoustic wave component 142 can include one or more acoustic wave in accordance with any suitable combination of features of the acoustic wave filters and/or acoustic wave resonators disclosed herein. The acoustic wave component 142 can include a SAW die that includes SAW resonators, for example.

The acoustic wave component 142 shown in FIG. 14 includes one or more acoustic wave filters 144 and terminals 145A and 145B. The one or more acoustic wave filters 144 includes an acoustic wave resonator with a relatively narrow IDT electrode aperture implemented in accordance with any suitable principles and advantages disclosed herein. The terminals 145A and 144B can serve, for example, as an input contact and an output contact. Although two terminals are illustrated, any suitable number of terminals can be implemented for a particular application. The acoustic wave component 142 and the other circuitry 143 are on a common packaging substrate 146 in FIG. 14. The package substrate 146 can be a laminate substrate. The terminals 145A and 145B can be electrically connected to contacts 147A and 147B, respectively, on the packaging substrate 146 by way of electrical connectors 148A and 148B, respectively. The electrical connectors 148A and 148B can be bumps or wire bonds, for example.

The other circuitry 143 can include any suitable additional circuitry. For example, the other circuitry can include one or more power amplifiers, one or more radio frequency switches, one or more additional filters, one or more low noise amplifiers, one or more RF couplers, one or more delay lines, one or more phase shifters, the like, or any suitable combination thereof. Low noise amplifiers and power amplifiers are examples of radio frequency amplifiers. The other circuitry 143 can be electrically connected to the one or more acoustic wave filters 144. The radio frequency module 140 can include one or more packaging structures to, for example, provide protection and/or facilitate easier handling of the radio frequency module 140. Such a packaging structure can include an overmold structure formed over the packaging substrate 146. The overmold structure can encapsulate some or all of the components of the radio frequency module 140.

Figure 15:
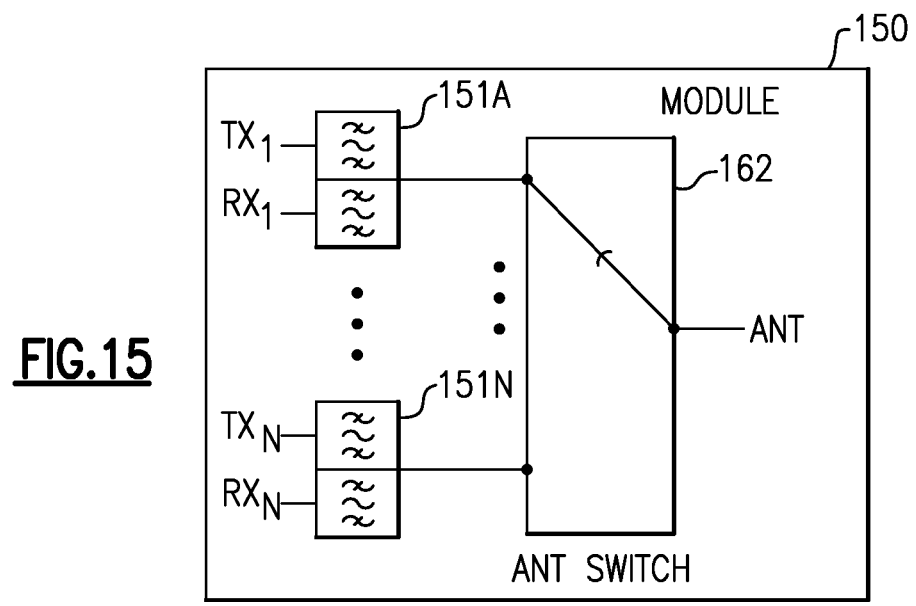
FIG. 15 is a schematic block diagram of a module that includes an antenna switch and duplexers according to an embodiment.

FIG. 15 is a schematic block diagram of a module 150 that includes duplexers 151A to 151N and an antenna switch 152. One or more filters of the duplexers 151A to 151N can include an acoustic wave resonator with a relatively narrow IDT electrode aperture in accordance with any suitable principles and advantages disclosed herein. Any suitable number of duplexers 151A to 151N can be implemented. The antenna switch 152 can have a number of throws corresponding to the number of duplexers 151A to 151N. The antenna switch 152 can include one or more additional throws coupled to one or more filters external to the module 150 and/or coupled to other circuitry. The antenna switch 152 can electrically couple a selected duplexer to an antenna port of the module 150.

Figures 16, 17:
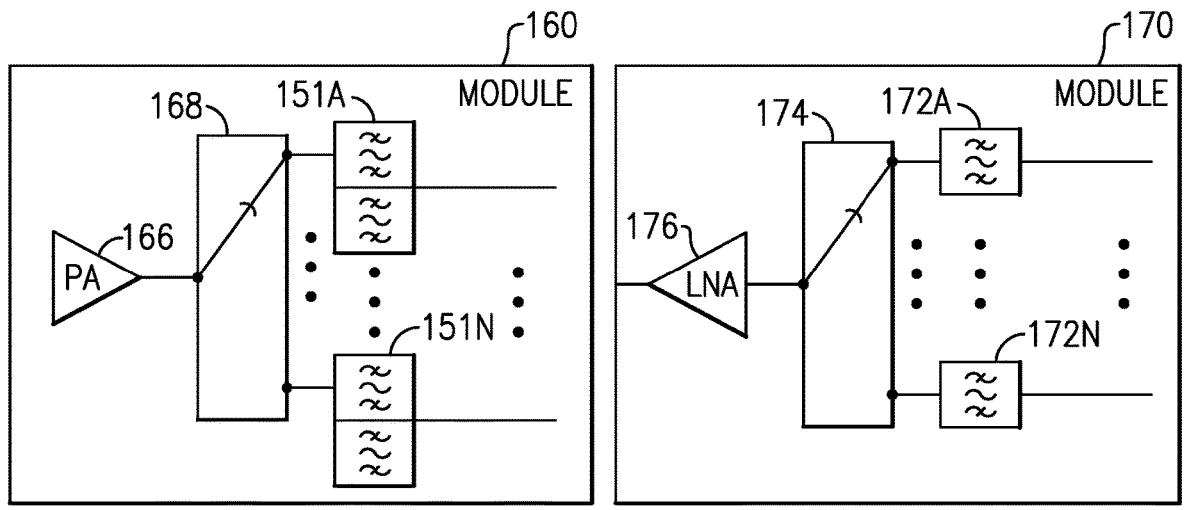
FIG. 16 is a schematic block diagram of a module that includes a power amplifier, a radio frequency switch, and duplexers according to an embodiment.
FIG. 17 is a schematic block diagram of a module that includes a low noise amplifier, a radio frequency switch, and acoustic wave filters according to an embodiment.

FIG. 16 is a schematic block diagram of a module 160 that includes a power amplifier 166, a radio frequency switch 168, and duplexers 151A to 151N according to an embodiment. The power amplifier 166 can amplify a radio frequency signal. The radio frequency switch 168 can be a multi-throw radio frequency switch. The radio frequency switch 168 can electrically couple an output of the power amplifier 166 to a selected transmit filter of the duplexers 161A to 161N. One or more filters of the duplexers 151A to 151N can include any suitable number of acoustic wave resonators that have a relatively narrow IDT electrode aperture in accordance with any suitable principles and advantages disclosed herein. Any suitable number of duplexers 151A to 151N can be implemented.

FIG. 17 is a schematic block diagram of a module 170 that includes filters 172A to 172N, a radio frequency switch 174, and a low noise amplifier 176 according to an embodiment. One or more filters of the filters 172A to 172N can include any suitable number of acoustic wave resonators that have a relatively narrow IDT electrode aperture in accordance with any suitable principles and advantages disclosed herein. Any suitable number of filters 172A to 172N can be implemented. The illustrated filters 172A to 172N are receive filters. In some embodiments (not illustrated), one or more of the filters 172A to 172N can be included in a multiplexer that also includes a transmit filter. The radio frequency switch 174 can be a multi-throw radio frequency switch. The radio frequency switch 174 can electrically couple an output of a selected filter of filters 172A to 172N to the low noise amplifier 176. In some embodiments (not illustrated), a plurality of low noise amplifiers can be implemented. The module 170 can include diversity receive features in certain applications.

Figure 18:
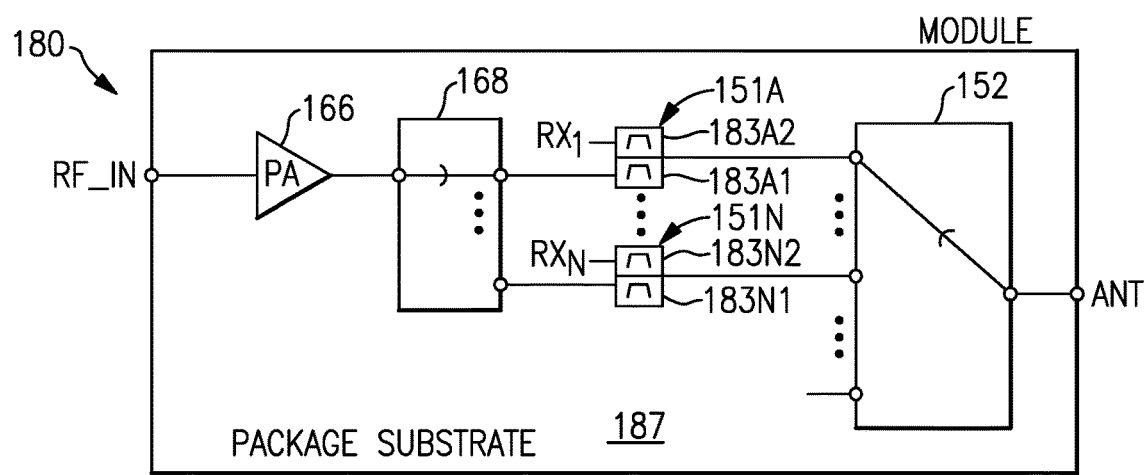
FIG. 18 is a schematic diagram of a radio frequency module that includes an acoustic wave filter according to an embodiment.

FIG. 18 is a schematic diagram of a radio frequency module 180 that includes an acoustic wave filter according to an embodiment. As illustrated, the radio frequency module 180 includes duplexers 151A to 151N that include respective transmit filters 183A1 to 183N1 and respective receive filters 183A2 to 183N2, a power amplifier 166, a select switch 168, and an antenna switch 152. The radio frequency module 180 can include a package that encloses the illustrated elements. The illustrated elements can be disposed on a common packaging substrate 187. The packaging substrate 187 can be a laminate substrate, for example. A radio frequency module that includes a power amplifier can be referred to as a power amplifier module. A radio frequency module that include a power amplifier and duplexers can be referred to as a power amplifier module with duplexers. A radio frequency module can include a subset of the elements illustrated in FIG. 18 and/or additional elements. One or more filters of radio frequency module 180 include at least one acoustic wave resonator with a relatively narrow IDT electrode aperture in accordance with any suitable principles and advantages disclosed herein.

The duplexers 151A to 151N can each include two acoustic wave filters coupled to a common node. For example, the two acoustic wave filters can be a transmit filter and a receive filter. As illustrated, the transmit filter and the receive filter can each be a band pass filter arranged to filter a radio frequency signal. One or more of the transmit filters 183A1 to 183N1 can include an acoustic wave resonator with a relatively narrow IDT electrode aperture in accordance with any suitable principles and advantages disclosed herein. Similarly, one or more of the receive filters 183A2 to 183N2 can include an acoustic wave resonator with a relatively narrow IDT electrode aperture in accordance with any suitable principles and advantages disclosed herein. Although FIG. 18 illustrates duplexers, any suitable principles and advantages disclosed herein can be implemented in other multiplexers (e.g., quadplexers, hexaplexers, octoplexers, etc.) and/or in switch-plexers.

The power amplifier 166 can amplify a radio frequency signal. The illustrated switch 168 is a multi-throw radio frequency switch. The switch 168 can electrically couple an output of the power amplifier 166 to a selected transmit filter of the transmit filters 183A1 to 183N1. In some instances, the switch 168 can electrically connect the output of the power amplifier 166 to more than one of the transmit filters 183A1 to 183N1. The antenna switch 152 can selectively couple a signal from one or more of the duplexers 161A to 161N to an antenna port ANT. The duplexers 151A to 151N can be associated with different frequency bands and/or different modes of operation (e.g., different power modes, different signaling modes, etc.). In some embodiments (not illustrated), one or more low noise amplifiers can be included in the module 180 to amplify one or more received radio frequency signals that are filtered by one or more of receive filters 183A2 to 183N2.

Figure 19A:
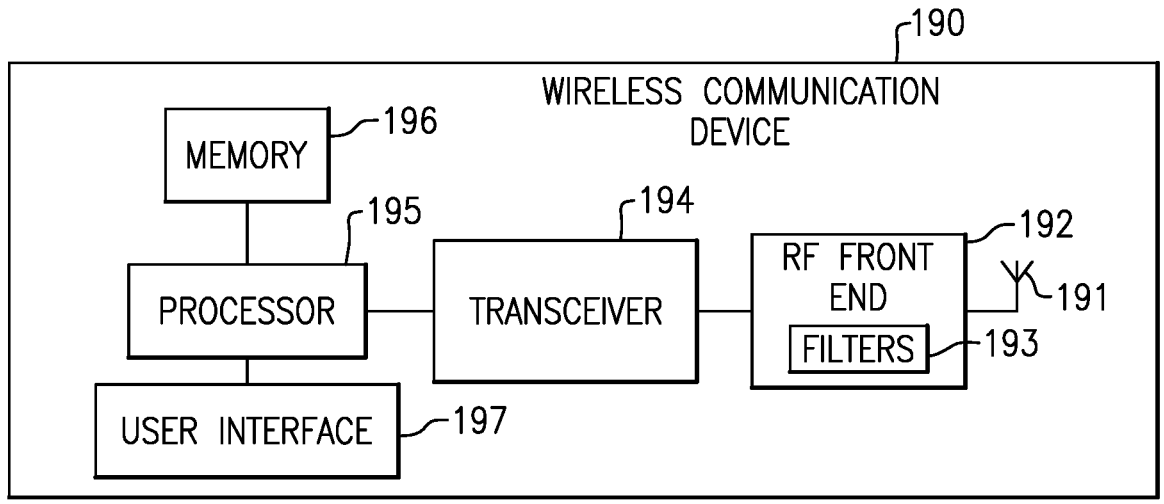
FIG. 19A is a schematic block diagram of a wireless communication device that includes an acoustic wave filter according to an embodiment.

The filters with increased skirt steepness disclosed herein can be implemented in a variety of wireless communication devices. FIG. 19A is a schematic diagram of a wireless communication 190 device that includes filters 193 in a radio frequency front end 192 according to an embodiment. One or more of the filters 193 can include an acoustic wave resonator with a relatively narrow IDT electrode aperture in accordance with any suitable principles and advantages disclosed herein. The wireless communication device 190 can be any suitable wireless communication device. For instance, a wireless communication device 190 can be a mobile phone, such as a smart phone. As illustrated, the wireless communication device 190 includes an antenna 191, an RF front end 192, a transceiver 194, a processor 195, a memory 196, and a user interface 197. The antenna 191 can transmit RF signals provided by the RF front end 192. Such RF signals can include carrier aggregation signals. The antenna 191 can receive RF signals and provide the received RF signals to the RF front end 192 for processing. Such RF signals can include carrier aggregation signals. The wireless communication device 190 can include two or more antennas in certain instances.

The RF front end 192 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 192 can transmit and receive RF signals associated with any suitable communication standards. One or more of the filters 193 can include an acoustic wave resonator with a transverse spurious mode concentrated in frequency that includes any suitable combination of features of the embodiments disclosed above.

The transceiver 194 can provide RF signals to the RF front end 192 for amplification and/or other processing. The transceiver 194 can also process an RF signal provided by a low noise amplifier of the RF front end 192. The transceiver 194 is in communication with the processor 195. The processor 195 can be a baseband processor. The processor 195 can provide any suitable base band processing functions for the wireless communication device 190. The memory 196 can be accessed by the processor 195. The memory 196 can store any suitable data for the wireless communication device 190. The user interface 197 can be any suitable user interface, such as a display with touch screen capabilities.

Figure 19B:
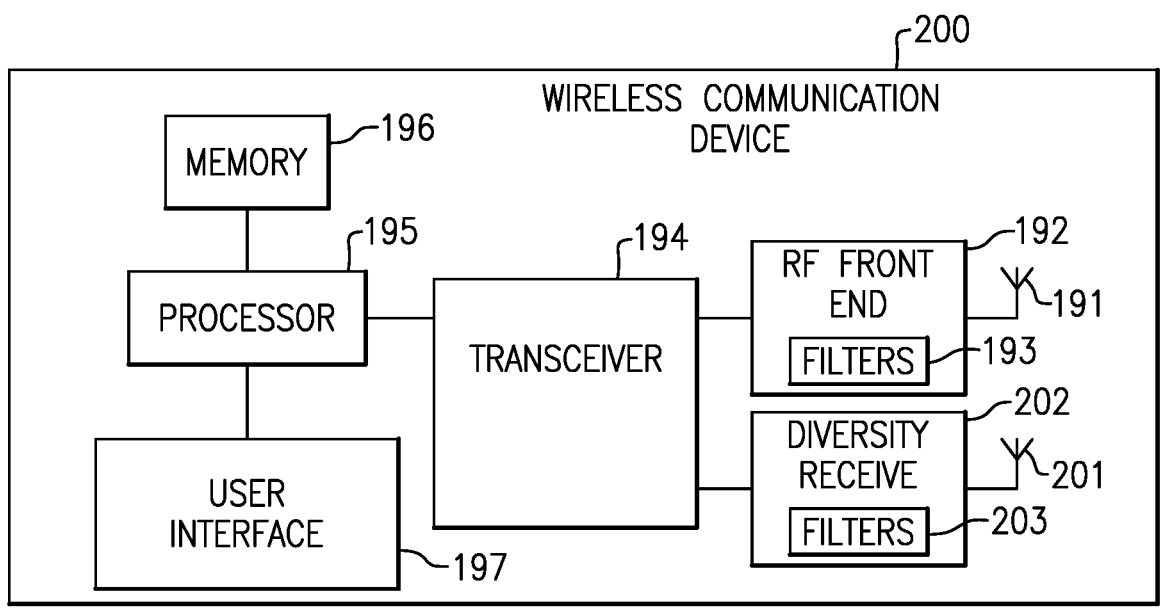
FIG. 19B is a schematic block diagram of another wireless communication device that includes an acoustic wave filter according to an embodiment.

FIG. 19B is a schematic diagram of a wireless communication device 200 that includes filters 193 in a radio frequency front end 192 and second filters 203 in a diversity receive module 202. The wireless communication device 200 is like the wireless communication device 190 of FIG. 19A, except that the wireless communication device 200 also includes diversity receive features. As illustrated in FIG. 19B, the wireless communication device 200 includes a diversity antenna 201, a diversity module 202 configured to process signals received by the diversity antenna 201 and including filters 203, and a transceiver 194 in communication with both the radio frequency front end 192 and the diversity receive module 202. One or more of the second filters 203 can include an acoustic wave resonator with a relatively narrow IDT electrode aperture in accordance with any suitable principles and advantages disclosed herein.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kHz to 300 GHz, such as in a frequency range from about 450 MHz to 8.5 GHz. Acoustic wave filters disclosed herein can filter RF signals at frequencies up to and including millimeter wave frequencies.

Aspects of this disclosure can be implemented in various electronic devices. Examples of the electronic devices can include, but are not limited to, consumer electronic products, parts of the consumer electronic products such as packaged radio frequency modules, radio frequency filter die, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure.

Indeed, the novel resonators, filters, multiplexer, devices, modules, wireless communication devices, apparatus, methods, and systems described herein may be embodied in a variety of other forms. Furthermore, various omissions, substitutions and changes in the form of the resonators, filters, multiplexer, devices, modules, wireless communication devices, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. An acoustic wave filter with a transverse spurious mode for improving skirt steepness, the acoustic wave filter comprising:
   a plurality of series acoustic wave resonators including at least a first acoustic wave resonator that includes an interdigital transducer electrode and configured to generate an acoustic wave having a wavelength of $\lambda$, the interdigital transducer electrode having a first aperture of less than $10\lambda$ to concentrate a transverse spurious mode above a resonate frequency, and the transverse spurious mode of the first acoustic wave resonator configured to improve steepness of a skirt of the acoustic wave filter; and
   a plurality of shunt acoustic wave resonators including at least a second acoustic wave resonator with a lower resonate frequency than the first acoustic wave resonator.

2. The acoustic wave filter of claim 1 wherein the first acoustic wave resonator does not include a piston mode structure and the second acoustic wave resonator does include a piston mode structure.

3. The acoustic wave filter of claim 2 wherein the plurality of series acoustic wave resonators include additional series acoustic wave resonators having respective interdigital transducer electrodes having first apertures of less than $10\lambda$.

4. The acoustic wave filter of claim 2 wherein a first pitch of the interdigital transducer electrode of the first acoustic wave resonator is different than a second pitch of a second interdigital transducer electrode of the second acoustic wave resonator.

5. The acoustic wave filter of claim 2 wherein the plurality of shunt acoustic wave resonators each include a shunt interdigital transducer electrode having an aperture of at least $15\lambda$.

6. The acoustic wave filter of claim 1 wherein the first aperture is less than $7\lambda$.

7. The acoustic wave filter of claim 1 wherein the first aperture is at least $3\lambda$.

8. The acoustic wave filter of claim 1 wherein the first aperture is at least $1\lambda$.

9. The acoustic wave filter of claim 1 wherein the first acoustic wave resonator does not include a piston mode structure.

10. The acoustic wave filter of claim 1 wherein skirt of the acoustic wave filter is above a cutoff frequency of an upper edge of a passband of the acoustic wave filter.

11. The acoustic wave filter of claim 1 wherein the first acoustic wave resonator is a temperature compensated surface acoustic wave resonator.

12. The acoustic wave filter of claim 1 wherein the acoustic wave filter is coupled to a common node, and a second acoustic wave filter is coupled to the common node.

13. The acoustic wave filter of claim 1 further comprising:
   a radio frequency amplifier; and
   a radio frequency switch coupled between the acoustic wave filter and the radio frequency amplifier, the acoustic wave filter, the radio frequency amplifier, and the radio frequency switch being enclosed within a common package.

14. A surface acoustic wave device comprising:
   a piezoelectric layer;
   a plurality of series acoustic wave resonators including at least a first surface acoustic wave resonator having an interdigital transducer electrode on the piezoelectric layer, the first surface acoustic wave resonator configured to generate a surface acoustic wave having a wavelength of $\lambda$, the interdigital transducer electrode having an aperture of less than $10\lambda$ to concentrate a transverse spurious mode at a frequency; and
   a plurality of shunt acoustic wave resonators including at least a second surface acoustic wave resonator with a lower resonate frequency than the first acoustic wave resonator.

15. The surface acoustic wave device of claim 14 wherein the aperture is less than $7\lambda$.

16. The surface acoustic wave device of claim 14 wherein the aperture is at least $3\lambda$.

17. The surface acoustic wave device of claim 14 wherein the aperture is at least $1\lambda$.

18. The surface acoustic wave device of claim 14 wherein the first surface acoustic wave resonator is a temperature compensated surface acoustic wave resonator without a piston mode structure.

19. The surface acoustic wave device of claim 14 wherein at least one surface acoustic wave resonator is coupled to a common node, and at least a second surface acoustic wave resonator is coupled to the common node.

20. A packaged radio frequency module comprising:
   a piezoelectric layer;
   a surface acoustic wave filter including a plurality of series acoustic wave resonators having at least a first acoustic wave resonator that includes at least one interdigital transducer electrode on the piezoelectric layer, the surface acoustic wave resonator configured to generate a surface acoustic wave having a wavelength of $\lambda$, the interdigital transducer electrode having an aperture of less than $10\lambda$ to concentrate a transverse spurious mode at a frequency, the acoustic wave filter further includes a plurality of shunt acoustic wave resonators including at least a second acoustic wave resonator with a lower resonate frequency than the first acoustic wave resonator;
   a radio frequency amplifier; and
   a radio frequency switch coupled between the acoustic wave filter and the radio frequency amplifier, the acoustic wave filter, the radio frequency amplifier, and the radio frequency switch being enclosed within a common package.

* * * * *